(12) United States Patent
Allen et al.

(10) Patent No.: US 7,193,023 B2
(45) Date of Patent: Mar. 20, 2007

(54) LOW ACTIVATION ENERGY PHOTORESISTS

(75) Inventors: Robert David Allen, San Jose, CA (US); Gregory Breyta, San Jose, CA (US); Phillip Joe Brock, Sunnyvale, CA (US); Richard Anthony DiPietro, Campbell, CA (US); Ratnam Sooriyakumaran, San Jose, CA (US); Hoa D. Truong, San Jose, CA (US); Gregory Michael Wallraff, Morgan Hill, CA (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 10/729,169

(22) Filed: Dec. 4, 2003

(65) Prior Publication Data

US 2005/0124774 A1 Jun. 9, 2005

(51) Int. Cl.
*C08F 112/68* (2006.01)

(52) U.S. Cl. .................. 526/242; 526/245; 526/246; 526/247

(58) Field of Classification Search ............... 526/242, 526/245, 246, 247
See application file for complete search history.

(56) References Cited

U.S. PATENT DOCUMENTS

| | | | |
|---|---|---|---|
| 4,356,296 | A | 10/1982 | Griffith et al. |
| 4,365,049 | A | 12/1982 | Tsunoda et al. |
| 4,452,998 | A | 6/1984 | Griffith et al. |
| 5,391,587 | A | 2/1995 | Wu |
| 5,665,527 | A | 9/1997 | Allen et al. |
| 5,919,597 | A | 7/1999 | Sinta et al. |
| 6,027,856 | A | 2/2000 | Nozaki et al. |
| 6,037,097 | A | 3/2000 | Bucchignano et al. |
| 6,043,003 | A | 3/2000 | Bucchignano et al. |
| 6,074,801 | A | 6/2000 | Iwasa et al. |
| 6,106,998 | A | 8/2000 | Maeda et al. |
| 6,140,010 | A | 10/2000 | Iwasa et al. |
| 6,146,806 | A | 11/2000 | Maeda et al. |
| 6,265,135 | B1 | 7/2001 | Kodama et al. |
| 6,319,650 | B1 | 11/2001 | Gelorme et al. |

FOREIGN PATENT DOCUMENTS

| | | |
|---|---|---|
| JP | 61281116 A | 11/1986 |
| WO | WO 01/86352 | 11/2001 |
| WO | WO 02/079287 | 10/2002 |
| WO | WO 03/040827 | 5/2003 |

OTHER PUBLICATIONS

Allen et al. (1997), "Deep-UV Resist Technology: The Evolution of Materials and Processes for 250-nm Lithography and Beyond," *Handbook of Microlithography, Micromachining, and Microfabrication Vol. 1: Microlithography*, Chapter 4, pp. 321-375, P. Rai-Choudhury, Editor, SPIE Optical Engineering Press.

Fedynyshyn et al. (2001), "High Resolution Fluorocarbon Based Resist for 157-nm Lithography," *Advances in Resist Technology And Processing XVIII, Proceedings of SPIE* 4345:296-307.

Kodama et al. (2002), "Synthesis of Novel Fluoropolymer for 157nm Photoresists by Cyclo-Polymerization," *Advances in Resist Technology and Processing XIX, Proceedings of SPIE* 4690:76-83.

Reichmanis et al. (1991), "Chemical Amplification Mechanisms for Microlithography," *Chem. Mater.* 3(3):394-407.

Urry et al. (1968), "Multiple Multicenter Reactions of Perfluoro Ketones with Olefins," *The Journal of Organic Chemistry* 33(6):2302-2310.

Bae et al. (2003), "Rejuvenation of 248 nm Resist Backbones for 157 nm Lithogrpahy," *Journal of Photopolymer Science and Technology* 14(4):613-620.

Hinsberg et al. (2000), "Effects of Resist Components on Image Spreading During Postexposure Bake of Chemically Amplified Resists," *Advances in Resist Technology and Processing XVII, Proceedings of SPIE* 3999:148-160.

Hinsberg et al. (2003), "Extendibility of Chemically Amplified Resists: Another Brick Wall?," *Advances in Resist Technology and Processing XX, Proceedings of SPIE* 5039:1-14.

Houle et al. (2000), "Determination of Coupled Acid Catalysis-Diffusion Processes in a Positive-Tone Chemically Amplified Photoresist," *J. Vac. Sci. Technol. B* 18(4):1874-1885.

Ito et al. (2001), "Polymer Design for 157 nm Chemically Amplified Resists," *Advances In Resist Technology And Processing XVIII, Proceedings Of SPIE* 4345:273-284.

Kunz et al. (2001), "Experimental VUV Absorbance Study of Fluorine-Functionalized Polystyrenes," *Advances in Resist Technology and Processing XVIII, Proceedings of SPIE* 4345:285-295.

*Primary Examiner*—Robert D. Harlan
(74) *Attorney, Agent, or Firm*—Mintz, Levin, Cohn, Ferris, Glovsky and Popeo, P.C.

(57) ABSTRACT

Polymers containing an acetal or ketal linkage and their use in lithographic photoresist compositions, particularly in chemical amplification photoresists, are provided. The polymer is prepared from at least one first olefinic monomer containing an acetal or ketal linkage, the acid-catalyzed cleavage of which renders the polymer soluble in aqueous base; and at least one second olefinic monomer selected from (i) an olefinic monomer containing a pendant fluorinated hydroxyalkyl group $R^H$, (ii) an olefinic monomer containing a pendant fluorinated alkylsulfonamide group $R^S$, and (iii) combinations thereof. The acetal or ketal linkage may be contained within an acid-cleavable substituent $R^{CL}$ in the first olefinic monomer. A method for using the photoresist compositions containing these polymers in preparing a patterned substrate is also provided in which the polymer is rendered soluble in aqueous base at a temperature of less than about 100° C. by acid-catalyzed deprotection of pendent acetal- or ketal-protected carboxylic acid groups.

56 Claims, 7 Drawing Sheets
(7 of 7 Drawing Sheet(s) Filed in Color)

NBHFAMA/ALMA 60/40
(5% PAG and 0.337% Base);
OD @193nm = 0.45/um; CA= 74.0 deg.
TGP at PAB and PEB

TGP @ PAB=100-130C (PEB=90C)

NBHFAMA/ALMA 60/40
(5% PAG and 0.337% Base);
OD @193nm = 0.45/um;  CA= 74.0 deg.
TGP at PAB and PEB

TGP @ PEB=68-88C (PAB=130C)

LOW ACTIVATION ENERGY PHOTORESISTS

TECHNICAL FIELD

This invention relates generally to the field of photolithography. More specifically, the invention relates to polymers containing an acetal or ketal linkage and their use in lithographic photoresist compositions, particularly in chemical amplification photoresists.

BACKGROUND OF THE INVENTION

The patterning of radiation sensitive polymeric films with high energy radiation such as photons, electrons, or ion beams is the principle means of defining high resolution circuitry found in semiconductor devices. The radiation sensitive films, often referred to as photoresists regardless of the radiation source, generally consist of multicomponent formulations that are coated onto a desired substrate such as a silicon wafer. The radiation is most commonly ultraviolet light at wavelengths of 436, 365, 257, 248, 193 or 157 nanometers (nm), or a beam of electrons or ions, or 'soft' x-ray radiation, also referred to as extreme ultraviolet (EUV) or x-rays. The radiation is exposed patternwise and induces a chemical transformation that renders the solubility of the exposed regions of the films different from that of the unexposed areas when the films are treated with an appropriate developer, usually a dilute, basic aqueous solution, such as aqueous tetramethylammonium hydroxide (TMAH).

Typical photoresists contain a polymeric component and are generally comprised of a polymeric matrix, a radiation sensitive component, a casting solvent, and other performance enhancing additives. The highest performing photoresists in terms of sensitivity to radiation and resolution capability are "chemically-amplified" photoresists, allowing high resolution, high contrast and high sensitivity that are not generally provided by other photoresists. Chemically amplified photoresists are based on a catalytic mechanism that allows a relatively large number of chemical events such as, for example, deprotection reactions in the case of positive photoresists or crosslinking reactions in the case of negative tone photoresists, to be brought about by the application of a relatively low dose of radiation that induces formation of the catalyst, often a strong acid.

Although chemically-amplified resists have been developed for 248, 193 and 157 nm lithography, certain barriers to achieving higher resolution and smaller feature sizes remain due to physical, processing and material limitations. One such phenomenon that arises for imaging in the sub-50 nm regime, resulting in diminished image integrity in the pattern, is referred to as "image blur" (see, e.g., Hinsberg et al., Proc. SPIE, (2000), 3999, 148 and Houle et al., J. Vac. Sci. Technol B, (2000), 18, 1874). Image blur is generally thought to result from two contributing factors: gradient-driven acid diffusion and reaction propagation, the result being a distortion in the developable image compared to the projected aerial image transferred onto the film. Although, both factors contribute to image blur, the degree of the effect from each is different. Temperature also has a differing effect on each factor.

Acid diffusion is further thought to depend on several factors, including the type of photoacid generator (PAG) and the mobility in the photoresist polymer. In turn, the acid mobility in the polymer is dependent on a variety of factors, including, among others, the chemical functionality of the polymer, and the temperature and time of baking during resist processing.

Reaction propagation likewise depends on a number of factors, such as the activation energy (enthalpy) and the volatility of products (entropy).

Thus, as the need for better resolutions, minimum feature sizes, improved sensitivity and process latitude increases, image blur due to both contributing factors must be minimized. While both may be reduced to a degree by the use of acid-quenchers, or bases, the extent of thermally induced image blur estimated to be on the order of 10–50 nm with conventional resists and processing (see also Breyta et al., U.S. Pat. No. 6,227,546) suggests that improvements are necessary in order to achieve sub-50 nm imaging.

An ongoing need therefore exists for new photoresist materials and compositions, as well as methods of patterning substrates, which can lead to improved high resolution photoresist applications.

SUMMARY OF THE INVENTION

The present invention addresses the aforementioned needs in the art, and provides improved polymers and photoresist compositions that are particularly suitable for photolithographic applications.

In one aspect of the invention, polymers containing an acetal or ketal linkage are provided that are suitable for incorporation into lithographic photoresist compositions. The polymer is prepared from at least one first olefinic monomer containing an acetal or ketal linkage, the acid-catalyzed cleavage of which renders the polymer soluble in aqueous base; and at least one second olefinic monomer selected from (i) an olefinic monomer containing a pendant fluorinated hydroxyalkyl group $R^H$, (ii) an olefinic monomer containing a pendant fluorinated alkylsulfonamide group $R^S$, and (iii) combinations thereof. The acetal or ketal linkage may be contained within an acid-cleavable substituent $R^{CL}$ in the first olefinic monomer. The acid cleavable substituent $R^{CL}$ is preferably a relatively reactive group, such that the process of cleaving $R^{CL}$ from the polymer has a fairly low activation energy. In this way, following exposure of the polymer to acid, e.g., a photogenerated acid, $R^{CL}$ can be cleaved from the polymer at a temperature that is sufficiently low to minimize certain disadvantageous conditions, such as image blur, by limiting the extent of acid diffusion and reaction propagation. Comonomers containing additional acid-cleavable substituents $R^{CL*}$, acid-inert polar groups $R^P$, and/or acid-inert nonpolar groups $R^{NP}$ may also be copolymerized with the first and second olefinic monomers to further modify the properties of the inventive polymer.

In another aspect of the invention, photoresist compositions are provided containing a photoacid generator in addition to the inventive polymer. These compositions may additionally contain other components, e.g., an additive such as a dissolution-modifying additive.

In a further aspect of the invention, a method for using the photoresist compositions containing these polymers in preparing a patterned substrate is also provided in which the polymer is rendered soluble in aqueous base at a temperature of less than about 100° C. by acid-catalyzed deprotection of pendent acetal- or ketal-protected carboxylic acid groups. In this regard, the photoresist compositions are useful in a process for patterning a substrate by: (a) coating the substrate with a film of a photoresist composition comprised of (i) a polymer that is rendered soluble in aqueous base at a temperature of less than about 100° C. by acid-catalyzed deprotection of pendent acetal- or ketal-protected carboxylic acid groups, and (ii) a photoacid generator; (b) patternwise exposing the film to an imaging radiation source so as to form a latent, patterned image in the film; (c) baking the exposed film at a post-exposure bake temperature below about 100° C.; and (d) developing the latent image with a developer to form a patterned substrate. The developer is selected so as to render the exposed regions of the film soluble. The surface of the substrate which is coated with the photoresist may be a semiconductor, ceramic, metallic, or organic material (e.g., an organic dielectric material or an organic underlayer of a bilayer resist). Exposure may be carried out using electron-beam, x-ray, or ultraviolet radiation, although radiation in the DUV and EUV, including 193 nm, 157 nm, and 13.4 nm, is preferred.

BRIEF DESCRIPTION OF THE FIGURES

The patent or application file contains at least one drawing executed in color. Copies of this patent or patent application publication with color drawing(s) will be provided by the Office upon request and payment of the necessary fee.

DETAILED DESCRIPTION OF THE INVENTION

I. Definitions and Nomenclature

Figure 1A:
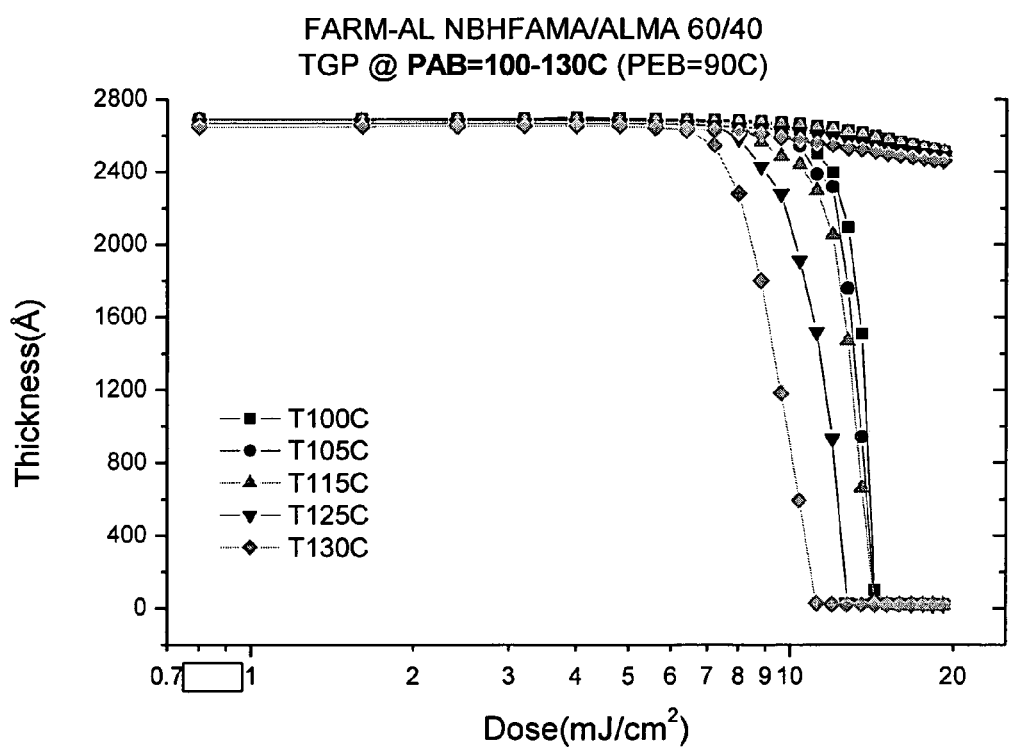
FIGS. 1A and 1B depict contrast curves for a fluoroacrylate resist material (Ex-FARM) based upon a copolymer of NBHFAMA (3-(5-Bicyclo-[2,2,1]hept-2-yl)-1,1,1-trifluoro-2-(trifluoromethyl)-2-propanol methacrylate) and ALMA (alpha-angelicalactone methacrylate).

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent that generally, although not necessarily, contains 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although again not necessarily, alkyl groups herein contain 1 to about 12 carbon atoms. The term "lower alkyl" intends an alkyl group of 1 to 6 carbon atoms, and the term "cycloalkyl" intends a cyclic alkyl group, typically having 3 to 12, preferably 3 to 8, carbon atoms. The term "substituted alkyl" refers to alkyl substituted with one or more substituent groups, i.e., wherein a hydrogen atom is replaced with a non-hydrogen substituent group, and the terms "heteroatom-containing alkyl" and "heteroalkyl" refer to alkyl substituents in which at least one carbon atom is replaced with a heteroatom such as O, N, or S. If not otherwise indicated, the terms "alkyl" and "lower alkyl" include linear, branched, cyclic, unsubstituted, substituted, and/or heteroatom-containing alkyl and lower alkyl, respectively.

The term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. Preferred alkylene linkages contain 1 to about 12 carbon atoms, and the term "lower alkylene" refers to an alkylene linkage of 1 to 6 carbon atoms, preferably 1 to 4 carbon atoms. The term "substituted alkylene" refers to an alkylene linkage substituted with one or more substituent groups, i.e., wherein a hydrogen atom is replaced with a non-hydrogen substituent group, and the terms "heteroatom-containing alkylene" and "heteroalkylene" refer to alkylene linkages in which at least one carbon atom is replaced with a heteroatom. If not otherwise indicated, the terms "alkylene" and "lower alkylene" include linear, branched, cyclic, unsubstituted, substituted, and/or heteroatom-containing alkylene and lower alkylene, respectively.

The term "alkoxy" as used herein refers to a group —O-alkyl wherein "alkyl" is as defined above.

The term "alicyclic" is used to refer to cyclic, non-aromatic compounds, substituents and linkages, e.g., cycloalkanes and cycloalkenes, cycloalkyl and cycloalkenyl substituents, and cycloalkylene and cycloalkenylene linkages. Often, the term refers to polycyclic compounds, substituents, and linkages, including bridged bicyclic, compounds, substituents, and linkages. Preferred alicyclic moieties herein contain 3 to about 30, typically 5 to about 14, carbon atoms. Unless otherwise indicated, the term "alicyclic" includes substituted and/or heteroatom-containing such moieties. It will be appreciated that the term "cyclic," as used herein, thus includes "alicyclic" moieties.

The term "heteroatom-containing" as in a "heteroatom-containing alkyl group" (also termed a "heteroalkyl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing. Examples of heteroalkyl groups include alkoxyalkyl, alkylsulfanyl-substituted alkyl, and the like.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted alkyl," and the like, as alluded to in some of the aforementioned definitions, is meant that in the alkyl, or other moiety, at least one hydrogen atom bound to a carbon (or other) atom is replaced with a non-hydrogen substituent. Examples of suitable substituents herein include halo, hydroxyl, sulfhydryl, $C_1$–$C_{12}$ alkoxy, acyl (including $C_2$–$C_{12}$ alkylcarbonyl (—CO-alkyl)), acyloxy (—O-acyl), $C_2$–$C_{12}$ alkoxycarbonyl (—(CO)—O-alkyl), $C_2$–$C_{12}$ alkylcarbonato (—O—(CO)—O-alkyl), carboxy (—COOH), carbamoyl (—(CO)—NH$_2$), mono-substituted $C_1$–$C_{12}$ alkylcarbamoyl (—(CO)—NH($C_1$–$C_{12}$ alkyl)), di-substituted alkylcarbamoyl (—(CO)—N($C_1$–$C_{12}$ alkyl)$_2$), cyano (—C≡N), cyanato (—O—C≡N), formyl (—(CO)—H), amino (—NH$_2$), mono- and di-($C_1$–$C_{12}$ alkyl)-substituted amino, mono- and $C_2$–$C_{12}$ alkylamido (—NH—(CO)-alkyl), imino (—CR=NH where R=hydrogen, $C_1$–$C_{12}$ alkyl. etc.), alkylimino (—CR=N (alkyl), where R=hydrogen, alkyl, etc.), $C_1$–$C_{20}$ alkylsulfanyl (—S-alkyl; also termed "alkylthio"), $C_5$–$C_{18}$ arylsulfanyl (—S-aryl; also termed "arylthio"), $C_1$–$C_{20}$ alkylsulfinyl (—(SO)-alkyl), $C_1$–$C_{20}$ alkylsulfonyl (SO$_2$-alkyl), phosphono (—P(O)(OH)$_2$), and the hydrocarbyl moieties $C_1$–$C_{24}$ alkyl (preferably $C_1$–$C_{12}$ alkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated. When the term "substituted" appears prior to a list of possible substituted groups, it is intended that the term apply to every member of that group.

The term "fluorinated" refers to replacement of a hydrogen atom in a molecule or molecular segment with a fluorine atom, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —CH$_2$F and —CHF$_2$ as well as the "perfluorinated" methyl group, i.e., —CF$_3$ (trifluoromethyl). The term "fluoroalkyl" refers to a fluorinated alkyl group, the term "fluoroalkylene" refers to a fluorinated alkylene linkage, the term "fluoroalicyclic" refers to a fluorinated alicyclic moiety, and the like.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-cleavable" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist compositions to radiation, by virtue of the photoacid generator contained in the compositions.

The term "substantially transparent" as used to describe a polymer that is "substantially transparent" to radiation of a particular wavelength refers to a polymer that has an absorbance of less than about 5.0/micron, preferably less than about 3.0/micron, most preferably less than about 1.5/micron, at a selected wavelength.

For additional information concerning terms used in the field of lithography and lithographic compositions, see *Introduction to Microlithography*, Eds. Thompson et al. (Washington, D.C.: American Chemical Society, 1994).

II. The Novel Polymers

In general, the polymers of the invention are formed from at least one first olefinic monomer containing an acetal or ketal linkage, the acid-catalyzed cleavage of which renders the polymer soluble in aqueous base; and at least one second olefinic monomer selected from (i) an olefinic monomer containing a pendant fluorinated hydroxyalkyl group $R^H$, (ii) an olefinic monomer containing a pendant fluorinated alkylsulfonamide group $R^S$, and (iii) combinations thereof.

The acetal or ketal linkage generally, although not necessarily, may be contained within an acid-cleavable substituent $R^{CL}$ in the first olefinic monomer, the acid-cleavable substituent having the structure

$$-(L^1)_m-(X)_n-(L^2)_q-R^1 \qquad (I)$$

in which m, n, and q are independently zero or 1;

$L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;

X is selected from $C_3$–$C_{30}$ alicyclic and substituted $C_3$–$C_{30}$ alicyclic;

$L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and $R^1$ is selected from acetal-containing and ketal-containing substituents.

In preferred $R^{CL}$ substituents:

$L^1$ is selected from $C_1$–$C_{12}$ alkylene, particularly $C_1$–$C_6$ alkylene, and heteroatom-containing $C_1$–$C_{12}$ alkylene;

X is $C_3$–$C_{18}$ alicyclic, particularly $C_6$–$C_{12}$ alicyclic;

$L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene; and $R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable.

Preferably, $L^2$ is of the formula —$CR^9R^{10}$— wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl; and $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to form a cyclic group.

In the case where the second olefinic monomer contains a pendant fluorinated hydroxyalkyl group $R^H$, it is preferred that $R^H$ has the structure -$L^3$-$CR^{11}R^{12}$—OH, in which:

$L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;

$R^{11}$ is selected from hydrogen, $C_1$–$C_{24}$ alkyl, and substituted $C_1$–$C_{24}$ alkyl; and $R^{12}$ is $C_1$–$C_{24}$ alkyl or fluorinated $C_1$–$C_{24}$ alkyl, with the proviso that at least one of $R^{11}$ and $R^{12}$ is fluorinated; and further wherein $R^{11}$ and $R^{12}$ can be taken together to form a ring.

In addition, $R^{11}$ may be selected from hydrogen, $C_1$–$C_{12}$ alkyl, and $C_1$–$C_{12}$ haloalkyl, and $R^{12}$ is $C_1$–$C_{12}$ alkyl or fluorinated $C_1$–$C_{12}$ alkyl; preferably, $R^{11}$ is selected from hydrogen, $C_1$–$C_8$ alkyl, and fluorinated $C_1$–$C_8$ alkyl, and $R^{12}$ is $C_1$–$C_8$ alkyl or fluorinated $C_1$–$C_8$ alkyl; and more preferably, $R^{11}$ is selected from hydrogen, $C_1$–$C_4$ alkyl, semi-fluorinated $C_1$–$C_4$ alkyl, and perfluorinated $C_1$–$C_4$ alkyl, and $R^{12}$ is $C_1$–$C_4$ alkyl, semi-fluorinated $C_1$–$C_4$ alkyl, or perfluorinated $C_1$–$C_4$ alkyl. It is most preferred that $R^{11}$ and $R^{12}$ are both trifluoromethyl.

In the case where the second olefinic monomer contains a pendant fluorinated alkylsulfonamide group $R^S$, it is preferred that $R^S$ has the structure -$L^3$-$SO_2$—$NHR^{16}$, in which:

$L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, combinations thereof; and $R^{16}$ is selected from $C_1$–$C_{24}$ alkyl and substituted $C_1$–$C_{24}$ alkyl, $C_1$–$C_{24}$ fluoroalkyl and substituted $C_1$–$C_{24}$ fluoroalkyl.

In another aspect, the polymer may be formed from a first olefinic monomer unit having the structure of formula (II)

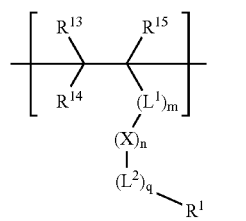

(II)

and a second olefinic monomer unit having the structure of formula (III)

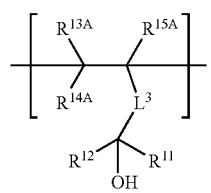

(III)

wherein m, n, and q are independently zero or 1;

$L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;

X is selected from $C_3$–$C_{30}$ alicyclic and substituted $C_3$–$C_{30}$ alicyclic;

$L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and $R^1$ is selected from acetal-containing and ketal-containing substituents;

$L^3$ is selected from $C_1$–$C_{12}$ alkylene, substituted $C_1$–$C_2$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;

$R^{11}$ is selected from hydrogen, $C_1$–$C_{24}$ alkyl, and substituted $C_1$–$C_{24}$ alkyl;

$R^{12}$ is $C_1$–$C_{24}$ alkyl or fluorinated $C_1$–$C_{24}$ alkyl, with the proviso that at least one of $R^{11}$ and $R^{12}$ is fluorinated; and further wherein $R^{11}$ and $R^{12}$ can be taken together to form a ring.

$R^{13}$ and $R^{13A}$ are independently selected from hydrogen, fluorine, $C_1$–$C_{24}$ alkyl, substituted $C_1$–$C_{24}$ alkyl, $C_1$–$C_{24}$ alkoxy, and substituted $C_1$–$C_{24}$ alkoxy; and $R^{14}$ and $R^{14A}$ are independently selected from hydrogen, fluorine, $C_1$–$C_{24}$ alkyl and substituted $C_1$–$C_{24}$ alkyl; and $R^{15}$ and $R^{15A}$ are independently selected from hydrogen, fluorine, $C_1$–$C_{24}$ alkyl, and substituted $C_1$–$C_{24}$ alkyl, and further wherein any two of $L^1$, $R^{13}$, $R^{14}$, and $R^{15}$ may be taken together to form a ring and any two of $L^3$, $R^{13A}$, $R^{14A}$, and $R^{15A}$ may be taken together to form a ring.

Preferred substituents for polymers having units of formulae (II) and (III) include:

$L^1$ is selected from $C_1$–$C_{12}$ alkylene, particularly $C_1$–$C_6$ alkylene, and heteroatom-containing $C_1$–$C_{12}$ alkylene;

X is $C_3$–$C_{18}$ alicyclic, particularly $C_6$–$C_{12}$ alicyclic;

$L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene;

$R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable;

$R^{11}$ is selected from hydrogen, $C_1$–$C_{12}$ alkyl, and $C_1$–$C_{12}$ haloalkyl; and $R^{12}$ is $C_1$–$C_{12}$ alkyl or fluorinated $C_1$–$C_{12}$ alkyl; and further wherein $R^{11}$ and $R^{12}$ can be taken together to form a ring.

As noted above, preferably, $L^2$ is of the formula —$CR^9R^{10}$—, wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl; and $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to for a cyclic group. Also, in additional aspects, $R^{11}$ may be selected from hydrogen, $C_1$–$C_{12}$ alkyl, and $C_1$–$C_{12}$ haloalkyl, and $R^{12}$ is $C_1$–$C_{12}$ alkyl or fluorinated $C_1$–$C_{12}$ alkyl; preferably, $R^{11}$ is selected from hydrogen, $C_1$–$C_8$ alkyl, and fluorinated $C_1$–$C_8$ alkyl, and $R^{12}$ is $C_1$–$C_8$ alkyl or fluorinated $C_1$–$C_8$ alkyl; and more preferably, $R^{11}$ is selected from hydrogen, $C_1$–$C_4$ alkyl, semi-fluorinated $C_1$–$C_4$ alkyl, and perfluorinated $C_1$–$C_4$ alkyl, and $R^{12}$ is $C_1$–$C_4$ alkyl, semi-fluorinated $C_1$–$C_4$ alkyl, or perfluorinated $C_1$–$C_4$ alkyl. It is most preferred that $R^{11}$ and $R^{12}$ are both trifluoromethyl.

The polymer may also be formed from a first olefinic monomer unit having the structure of formula (II)

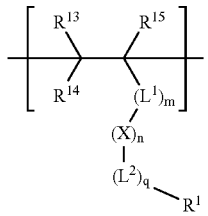
(II)

and a second olefinic monomer unit having the structure of formula (IV)

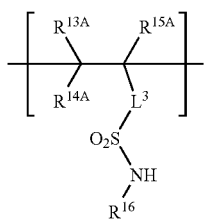
(IV)

wherein m, n, and q are independently zero or 1;

$L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;

X is selected from $C_3$–$C_{30}$ alicyclic and substituted $C_3$–$C_{30}$ alicyclic;

$L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and $R^1$ is selected from acetal-containing and ketal-containing substituents;

$L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;

$R^{13}$ and $R^{13A}$ are independently selected from hydrogen, fluorine, $C_1$–$C_{24}$ alkyl, substituted $C_1$–$C_{24}$ alkyl, $C_1$–$C_{24}$ alkoxy, and substituted $C_1$–$C_{24}$ alkoxy; and $R^{14}$ and $R^{14A}$ are independently selected from hydrogen, fluorine, $C_1$–$C_{24}$ alkyl and substituted $C_1$–$C_{24}$ alkyl;

$R^{15}$ and $R^{15A}$ are independently selected from hydrogen, fluorine, $C_1$–$C_{24}$ alkyl, and substituted $C_1$–$C_{24}$ alkyl, and further wherein any two of $L^1$, $R^{13}$, $R^{14}$, and $R^{15}$ may be taken together to form a ring and any two of $L^3$, $R^{13A}$, $R^{14A}$, and $R^{15A}$ may be taken together to form a ring; and $R^{16}$ is selected from $C_1$–$C_{24}$ alkyl and substituted $C_1$–$C_{24}$ alkyl, $C_1$–$C_{24}$ fluoroalkyl and substituted $C_1$–$C_{24}$ fluoroalkyl.

Preferred substituents for polymers having units of formulae (II) and (IV) include:

$L^1$ is selected from $C_1$–$C_{12}$ alkylene, particularly $C_1$–$C_6$ alkylene, and heteroatom-containing $C_1$–$C_{12}$ alkylene;

X is $C_3$–$C_{18}$ alicyclic, particularly $C_6$–$C_{12}$ alicyclic;

$L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene; and $R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable.

As noted above, preferably, $L^2$ is of the formula —$CR^9R^{10}$—, wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl; and $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to form a cyclic group.

Preferred representative monomers suitable for forming the polymer monomer units of formula (II) include, without limitation:

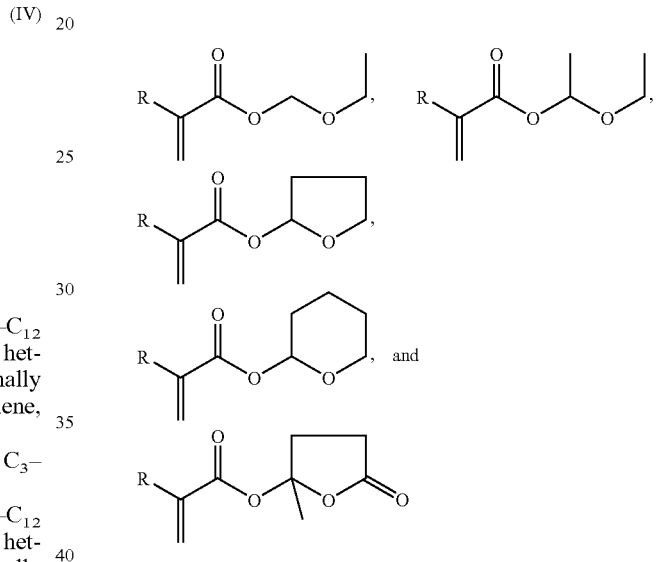

where R is selected from hydrogen, fluorine, $C_1$–$C_{24}$ alkyl, and fluorinated $C_1$–$C_{24}$ alkyl.

The polymer may also be formed from a mixture of two or more different first monomers and may also include at least one additional olefinic comonomer, e.g., thereby forming ter-, tetra- or multi-monomer polymers. While not strictly limited, such additional monomers include monomers containing an acid-cleavable substituent $R^{CL*}$; monomers containing an acid-inert, polar substituent, $R^P$; monomers containing an acid-inert, nonpolar substituent, $R^{NP}$; and combinations thereof.

The additional monomers containing an acid-cleavable substituent $R^{CL*}$ are not limited to particular groups, and may include acid-cleavable ester, oligomeric ester, ether, carbonate, orthoester substituents, and the like. Such groups provide additional flexibility by allowing for the acid activation to be tailored as desired, e.g., by combining a low activation energy acid-cleavable group with a higher activation energy acid-cleavable group. Generally, although not necessarily, the acetal or ketal linkage may be contained within an acid-cleavable substituent $R^{CL*}$ in the additional olefinic monomer, the acid-cleavable substituent having the structure

(V)

in which m*, n*, and q* are independently zero or 1;

r* is an integer of at least 1;

L$^{1}$* is selected from C$_1$–C$_{12}$ alkylene, substituted C$_1$–C$_{12}$ alkylene, C$_1$–C$_{12}$ heteroalkylene, substituted C$_1$–C$_{12}$ heteroalkylene, and further wherein when L$^{1}$* is optionally substituted and/or heteroatom-containing C$_3$–C$_{12}$ alkylene, L$^{1}$* may be linear, branched, or cyclic;

X* is selected from C$_3$–C$_{30}$ alicyclic and substituted C$_3$–C$_{30}$ alicyclic;

L$^{2}$* is selected from C$_1$–C$_{12}$ alkylene, substituted C$_1$–C$_{12}$ alkylene, C$_1$–C$_{12}$ heteroalkylene, substituted C$_1$–C$_{12}$ heteroalkylene, and further wherein when L$^{2}$* is optionally substituted and/or heteroatom-containing C$_3$–C$_{12}$ alkylene, L$^{2}$* may be linear, branched, or cyclic; and R$^{1}$* is selected from acid-cleavable ester, oligomeric ester, ether, carbonate, and orthoester substituents.

In preferred R$^{CL}$* substituents:

r* is 1 or 2;

L$^{1}$* is selected from C$_1$–C$_2$ alkylene, particularly C$_1$–C$_6$ alkylene, and heteroatom-containing C$_1$–C$_{12}$ alkylene;

X* is C$_3$–C$_{18}$ alicyclic, more preferably C$_6$–C$_{12}$ alicyclic;

L$^{2}$* is selected from C$_1$–C$_{12}$ alkylene, hydroxyl-substituted C$_1$–C$_{12}$ alkylene, C$_1$–C$_{12}$ fluoroalkylene, and hydroxyl-substituted C$_1$–C$_{12}$ fluoroalkylene; and R$^{1}$* is selected from —(CO)—O—R$^{4}$*, -[Q$^{1}$*-(CO)—O—]$_h$*—R$^{5}$*, —O—R$^{6}$*, and —(CO)—O—R$^{7}$*;

h* is an integer in the range of 2 to 8 inclusive,

Q$^{1}$* is C$^{1}$–C$_{12}$ alkylene or C$_1$–C$_{12}$ fluoroalkylene,

R$^{4}$* and R$^{6}$* are selected from (a) hydrocarbyl substituents with a tertiary carbon attachment point, (b) substituents having the structure —CR$^{8}$*R$^{9}$*—O—CR$^{10}$*R$^{11}$*R$^{12}$*, and (c) substituents having the structure —CR$^{13}$*(OR$^{14}$*)$_2$;

R$^{5}$*, R$^{7}$*, and R$^{14}$* are selected from C$_4$–C$_{12}$ hydrocarbyl, substituted C$_4$–C$_{12}$ hydrocarbyl, heteroatom-containing C$_4$–C$_{12}$ hydrocarbyl, and substituted heteroatom-containing C$_4$–C$_{12}$ hydrocarbyl; and R$^{8}$*, R$^{9}$*, R$^{10}$*, R$^{11}$*, R$^{12}$*, and R$^{13}$* are independently selected from hydrogen, C$_4$–C$_{12}$ hydrocarbyl, substituted C$_4$–C$_{12}$ hydrocarbyl, heteroatom-containing C$_4$–C$_{12}$ hydrocarbyl, and substituted heteroatom-containing C$_4$–C$_{12}$ hydrocarbyl, and further wherein any two of R$^{8}$*, R$^{9}$*, R$^{10}$*, R$^{11}$*, and R$^{12}$* may be linked to form a cyclic group.

Preferably, L$^{2}$* is of the formula —CR$^{9}$*R$^{10}$*—, wherein R$^{9}$* is hydrogen, C$_1$–C$_{12}$ alkyl, or C$_1$–C$_{12}$ fluoroalkyl, and R$^{10}$* is C$_1$–C$_{12}$ alkyl or C$_1$–C$_{12}$ fluoroalkyl; and R$^{4}$*, R$^{5}$*, R$^{6}$*, R$^{7}$*, and R$^{8}$* are independently selected from hydrogen, C$_4$–C$_{12}$ hydrocarbyl, substituted C$_4$–C$_{12}$ hydrocarbyl, heteroatom-containing C$_4$–C$_{12}$ hydrocarbyl, and substituted heteroatom-containing C$_4$–C$_{12}$ hydrocarbyl, and further wherein any two of R$^{4}$*, R$^{5}$*, R$^{6}$*, R$^{7}$*, and R$^{8}$ may be linked to form a cyclic group.

R$^{4}$* and R$^{6}$* may further be selected from cyclic and acyclic hydrocarbyl substituents with a tertiary carbon attachment point. Specific groups include, without limitation, t-butyl, 2-methyl-2-norbornyl, 2-methyl-2-adamantyl, 2-ethyl-2-adamantyl, isobornyl, 2-methyl-2-isobornyl, 2-methyl-2-tetracyclododecyl, 1-methylcyclohexyl, 1-ethylcyclohexyl, 1-butylcyclohexyl, 1-methylcyclopentyl, 1-ethylcyclopentyl, and 1-butylcyclopentyl.

The polar substituent R$^P$ may be, for example, an anhydride, lactone, imide, fluoroalcohol, carboxylic acid, sulfonamide, or the like. Although not limited thereto, the polar substituent R$^P$ may have the structure (VIII):

   (VIII)

in which m1, n1, and q1 are independently zero or 1;

L$^3$ is defined as for L$^1$, i.e., L$^3$ is selected from C$_1$–C$_{12}$ alkylene, substituted C$_{1-C12}$ alkylene, C$_1$–C$_{12}$ heteroalkylene, substituted C$_1$–C$_{12}$ heteroalkylene, and further wherein when L$^3$ is optionally substituted and/or heteroatom-containing C$_3$–C$_{12}$ alkylene, L$^1$ may be linear, branched, or cyclic;

Y is defined as for X, i.e., Y is selected from C$_3$–C$_{30}$ alicyclic-and substituted C$_3$–C$_{30}$ alicyclic;

L$^4$ is defined as for L$^2$, i.e., L$^4$ is selected from C$_1$–C$_{12}$ alkylene, substituted C$_1$–C$_{12}$ alkylene, C$_1$–C$_{12}$ heteroalkylene, substituted C$_1$–C$_{12}$ heteroalkylene; preferably, C$_1$–C$_{12}$ alkylene, hydroxyl-substituted C$_1$–C$_{12}$ alkylene, C$_1$–C$_{12}$ fluoroalkylene, and hydroxyl-substituted C$_1$–C$_{12}$ fluoroalkylene; and further wherein when L$^4$ is optionally substituted and/or heteroatom-containing C$_3$–C$_{12}$ alkylene, L$^4$ may be linear, branched, or cyclic; and R$^{18}$ is an acid-inert, polar organic group containing a heteroatom with a Pauling electronegativity greater than about 3.00.

Preferred such acid-inert, polar substituents R$^P$ are those wherein:

L$^3$ is selected from C$_1$–C$_{12}$ alkylene, particularly C$_1$–C$_6$ alkylene, and heteroatom-containing C$_1$–C$_{12}$ alkylene;

Y is C$_3$–C$_{18}$ alicyclic, particularly C$_6$–C$_{12}$ alicyclic; and

Preferably, L$^4$ is of the formula —CR$^{21}$CR$^{22}$— wherein R$^{21}$ is hydrogen, C$_1$–C$_{12}$ alkyl, or C$_1$–C$_{12}$ fluoroalkyl, and R$^{22}$ is C$_1$–C$_{12}$ alkyl or C$_1$–C$_{12}$ fluoroalkyl.

The heteroatom of R$^{18}$ is preferably O or N. Although not limited thereto, exemplary R$^{18}$ groups include hydroxyl, carboxyl, C$_1$–C$_{12}$ alkoxy, C$_1$–C$_{12}$ fluoroalkoxy, hydroxyl-substituted C$_1$–C$_{12}$ alkoxy, hydroxyl-substituted C$_1$–C$_{12}$ fluoroalkoxy, C$_2$–C$_{12}$ alkoxyalkyl, fluorinated C$_2$–C$_{12}$ alkoxyalkyl, hydroxyl-substituted C$_2$–C$_{12}$ alkoxyalkyl, fluorinated hydroxyl-substituted C$_2$–C$_{12}$ alkoxyalkyl, hydroxyl-substituted C$_1$–C$_{12}$ alkyl, hydroxyl-substituted C$_1$–C$_{12}$ fluoroalkyl, carboxyl-substituted C$_1$–C$_{12}$ alkyl, carboxyl-substituted C$_1$–C$_{12}$ fluoroalkyl, C$_2$–C$_{12}$ acyl, fluorinated C$_2$–C$_{12}$ acyl, hydroxyl-substituted C$_2$–C$_{12}$ acyl, fluorinated hydroxyl-substituted C$_2$–C$_{12}$ acyl, C$_2$–C$_{12}$ acyloxy, fluorinated C$_2$–C$_{12}$ acyloxy, hydroxyl-substituted C$_2$–C$_{12}$ acyloxy, fluorinated hydroxyl-substituted C$_2$–C$_{12}$ acyloxy, amino, mono- and di-(C$_1$–C$_{12}$ alkyl)-substituted amino, amido, mono- and di-(C$_2$–C$_{12}$ alkyl)amido, sulfonamido, N-heteroalicyclic, oxo-substituted N-heterocyclic, and, where the substituents permit, combinations of two or more of the foregoing.

Representative preferred polar substituents R$^P$ include lactone, anhydride, sulfonamide, fluoroalkanol, alkanol, alicyclic alkanol, esters, ethers, and a combination thereof.

In another aspect, the polymer may contain at least one acid-inert, non-polar substituent R$^{NP}$. Exemplary such groups, without limitation, may be selected from C$_1$–C$_{18}$ hydrocarbyl and substituted C$_1$–C$_{18}$ hydrocarbyl, e.g., fluorinated C$_1$–C$_{18}$ hydrocarbyl. Acid-inert R$^{NP}$ moieties include, by way of example, C$_1$–C$_{18}$ alkyl, C$_1$–C$_{18}$ hydroxyalkyl, fluorinated C$_1$–C$_{18}$ alkyl, and fluorinated C$_1$–C$_{18}$ hydroxyalkyl. Examples of fluorinated hydroxyalkyl groups include, without limitation, fluorinated lower alkanol groups having the structure -(L)$_x$-CQ$^1$Q$^2$-OH, wherein x is zero or 1, L is a linker (e.g., L$^1$ or L$^2$ as defined earlier herein), Q$^1$ is F or CF$_3$, and Q$^2$ is H, F, or CF$_3$.

In another aspect of the invention, at least one additional polymer may be combined with the polymer to form a blend composition, including fluorine-containing or non-fluorine containing polymers.

III. Photoresist Compositions

In another embodiment, a photoresist composition is provided that comprises both the inventive polymer, as described in detail above, and a photoacid generator, with the polymer representing up to about 99 wt. % of the solids included in the composition, and the photoacid generator representing approximately 0.1 to 25 wt. % of the solids contained in the composition. Other components and additives may also be present, e.g., dissolution modifying additives such as dissolution inhibitors.

The photoacid generator may be any compound that, upon exposure to radiation, generates a strong acid and is compatible with the other components of the photoresist composition. Examples of preferred photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., stable to at least 140° C., so they are not degraded during pre-exposure processing.

Any suitable photoacid generator can be used in the photoresist compositions of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate(diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethysulfonyl)diazomethane, and bis(cyclohexylsulfonyl) diazomethane;

(4) trifluoromethanesulfonate esters of imides and hydroxyimides, e.g., α-methylsulfonyloxy)-bicyclo[2.2.1]hept-5-ene-2,3-dicarboximide (MDT);

(5) nitrobenzyl sulfonate esters such as 2-nitrobenzyl p-toluenesulfonate, 2,6-dinitribenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);
(8) naphthoquinone-4-diazides;
(9) alkyl disulfones;
(10) s-triazine derivatives, as described in U.S. Pat. No. 4,189,323; and
(10) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichlnanis et al. (1991), *Chemistry of Materials* 3:395, and in U.S. Pat. No.5,679,495 to Yamachika et al. Additional suitable acid generators useful in conjunction with the compositions and methods provided herein will be known to those skilled in the art and/or are described in the pertinent literature.

A dissolution modifying additive, generally although not necessarily a dissolution is typically included. If a dissolution inhibitor is present, it will typically represent in of about 1 wt. % to 40 wt. %, preferably about 5 wt. % to 30 wt. %, of the total solids.

Preferred dissolution inhibitors have high solubility in the resist composition and in the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater). Suitable dissolution inhibitors include, but are not limited to, bisphenol A derivatives, e.g., wherein one or both hydroxyl moieties are converted to a t-butoxy substituent or a derivative thereof such as a t-butoxycarbonyl or t-butoxycarbonylmethyl group; fluorinated bisphenol A derivatives such as $CF_3$-bisphenol A-$OCH_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym. Sci. Technol.*, cited supra); hydroxyl-substituted analogs of such compounds (ibid.); and androstane-17-alkylcarboxylates substituted with one to three $C_1$–$C_4$ fluoroalkyl carbonyloxy substituents, such as t-butyl trifluoroacetyllithocholate (see, e.g., U.S. Pat. No. 5,580,694 to Allen et al.).

The remainder of the resist composition is composed of a solvent and may additionally, if necessary or desirable, include customary additives such as dyes, sensitizers, additives used as stabilizers, dissolution modifying additives, and acid-diffusion controlling agents, basic compounds, coating aids such as surfactants or anti-foaming agents, crosslinking agents, photospeed control agents, adhesion promoters and plasticizers.

The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. In addition to the above components, the photoresist compositions provided herein generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise the unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist formulation is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

The photoresist compositions of the invention may also contain polymers selected to provide or increase certain properties, such as transparency at a predetermined, desired wavelength, increase dry etch resistance, and/or improve aqueous base development. Representative such polymers are disclosed in published U.S. patent application 2003/0171490 A1 to Breyta et al., for "Polymer Blend and Associated Methods of Preparation and Use," assigned to International Business Machines Corporation. Polymers that are non-fluorine-containing or fluorine-containing may be used. Of the latter, preferred polymers contain monomer units bearing a fluoroalcohol group, such as NBHFA (bicyclo[2.2.1]hept-5-ene-2-(1,1,1-trifluoro-2-trifluoromethyl-propan-2-ol). These polymers may be NBHFA homopolymers ("PNBHFA") or copolymers of NBHFA with other monomers, including, without limitation, other norbornene monomers.

IV. Use in Generation Resist Images on a Substrate

The present invention also relates to a process for generating a resist image on a substrate. In general, the process involves: (a) coating a substrate with a film of a photoresist composition provided herein; (b) patternwise exposing the film to an imaging radiation source so as to form a latent, patterned image in the film; (c) baking the exposed film at a post-exposure bake temperature below about 100° C.; and (d) developing the latent image with a developer to form a patterned substrate.

The first step involves coating the substrate with a film comprising the resist composition dissolved in a suitable solvent. Suitable substrates are ceramic, metallic or semi-conductive, and preferred substrates are silicon-containing, including, for example, silicon dioxide, silicon nitride, and silicon oxynitride. The substrate may or may not be coated with an organic anti-reflective layer prior to deposition of the resist composition.

Preferably, the surface of the substrate is cleaned by standard procedures before the film is deposited thereon. Suitable solvents for the composition are as described previously herein, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film may be subjected to a prebake step at a temperature and for a time sufficient to remove residual solvent. Such prebake temperatures are generally in the range of about 90–150° C., preferably below about 130° C., more typically in the range of about 80–120° C., for a short period of time, typically on the order of about 1 minute. The dried film has a thickness of about 0.02 to 5.0 microns, preferably about 0.05 to 2.5 microns, and most preferably about 0.10 to 1.0 microns. The radiation may be ultraviolet, electron beam or x-ray. Ultraviolet radiation is preferred, particularly deep ultraviolet radiation having a wavelength of less than about 250 nm, e.g., 157 nm using an $F_2$ excimer laser. The radiation is absorbed by the radiation-sensitive acid generator to generate free acid, which with heating causes cleavage of the acid-labile pendant groups and formation of the corresponding acid.

The "post-exposure bake" (PEB) processing is carried out by baking the exposed film at a post-exposure bake temperature below about 100° C., and typically in the range of about 25° C. to about 100° C. Preferably, the PEB is carried out at a temperature in the-range of about 25° C. to about 80° C., more preferably at a temperature in the range of about 25° C. to about 50° C.

The fourth step involves development of the image with a suitable solvent. Suitable solvents include an aqueous base, preferably an aqueous base without metal ions such as the industry standard developer tetramethylammonium hydroxide or choline. Other solvents may include organic solvents or carbon dioxide (in the liquid or supercritical state), as disclosed in U.S. Pat. No. 6,665,527 to Allen et al. The resist composition may be used with DUV wavelengths of 157 nm, 193 nm, or 248 nm, or with EUV (e.g., at 13 nm), electron beam or x-ray radiation.

In the manufacture of integrated circuits, circuit patterns can be formed in the exposed areas after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. Examples of such processes are disclosed in U.S. Pat. Nos. 4,855,017, 5,362,663, 5,429,710, 5,562,801, 5,618,751, 5,744,376, 5,801,094, and 5,821,469. Other examples of pattern transfer processes are described in Chapters 12 and 13 of Moreau, *Semiconductor Lithography, Principles, Practices, and Materials* (Plenum Press, 1988). It should be understood that the invention is not limited to any specific lithographic technique or device structure.

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

EXAMPLES

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures.

Where appropriate, the following techniques and equipment were utilized in the Examples: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofiran (THF) on a Waters Model 150 chromatograph relative to polystyrene standards. IR spectra were recorded on a Nicolet 510 FT-IR spectrometer on a film cast on a KBr plate. UV measurements at 157 nm were performed using a Varian Cary Model 400 spectrometer on multiple thickness on CaF$_2$ discs. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26). Contact angles were measured on an AST Products VCA 2500XE video contact angle system using 2 μL of filtered deionized water.

Example 1

Synthesis of Ethoxymethyl methacrylate (EMMA)

To a 500-mL, 3-necked round bottomed flask equipped with a thermocouple temperature monitor, 250-mL addition funnel, nitrogen inlet and a magnetic stirrer was added 150 mL of dichloromethane, and 18.9 g (0.22 mol) of methacrylic acid. The addition funnel was charged with a mixture of 22.3 g (0.23 mol) of triethylamine and 25 mL of dichloromethane which was then added in a thin stream to the flask with stirring in an ice-bath. Upon completion of the addition, the addition funnel was recharged with a mixture of 18.9 g (0.2 mol) of chloromethyl ethyl ether and 25 mL of dichloromethane which was subsequently added dropwise to the reaction mixture with cooling over about 15 minutes. The ice bath was removed and the mixture stirred at room temperature overnight. The resulting suspension was filtered and the filtrate washed several times with saturated bicarbonate, water and brine and dried over anhydrous magnesium sulfate. Filtration and removal of the solvent by evaporation on a rotary evaporator provided 26.1 g of a yellowish oil which was distilled at reduced pressure to provide 20.3 g (70%) of the title compound as a clear, colorless oil.

Example 2

Synthesis of 2-Ethoxy-2-ethyl methacrylate (EEMA)

To a 500-mL, 3-necked round bottomed flask equipped with a thermocouple temperature monitor, nitrogen inlet and a magnetic stirrer was added 300 mL of ethyl vinyl ether and 25.0 g (0.29 mol) of methacrylic acid. The mixture was cooled in an ice bath and 0.2 g (0.001 mol) of p-toluene-sulfonic acid monohydrate was added. The flask was removed from the ice bath and stirred for 4 hours at which time the mixture was filtered through a bed of sodium carbonate and the ethyl vinyl ether removed on a rotary evaporator. The resulting oil was distilled twice from sodium carbonate at reduced pressure to yield 8.9 g (20%) of the title compound as a clear, colorless oil.

Example 3

Synthesis of 2-Ethoxy-2-ethyl trifluoromethacrylate (EETFMA)

14.0 g of 2-trifluoromethylacrylic acid (2-TFMAA) and 30 g of ethyl vinyl ether were stirred at room temperature under nitrogen and using a DRY ICE condenser. The initial endotherm gave way to a mild exotherm to approximately 33° C. and some outgassing (reflux). The reaction was complete in 15 minutes. Et$_2$O added. Organics were washed with 10% Na$_2$CO$_3$ (containing a small amount of NaOH), saturated NaHCO$_3$ and finally brine followed by drying with MgSO$_4$. Evaporated on rotary evaporator at 30° C. Yield 29.0 g of colorless liquid.

Example 4

Synthesis of 2-Tetrahydrofuranyl methacrylate (THFMA)

To a 500-mL, 3-necked round bottomed flask equipped with a thermocouple temperature monitor, nitrogen inlet and a magnetic stirrer was added 300 mL of dichloromethane, 24.5 g (0.29 mol) of methacrylic acid and 21.4 g (0.305 mol) of 2,3-dihydrofuran. The flask was cooled under Nitrogen to −40° C. and 0.05 g of methanesulfonic acid was added. The mixture was warmed to 0° C. and stirred for 6 hours at which time it was recooled to −40° C. and an excess (1 mL) of triethylamine was added. The solution was then washed with saturated sodium bicarbonate, water and brine and dried over anhydrous magnesium sulfate. Distillation from sodium carbonate at reduced pressure resulted in 26 g (58%) of the title compound.

Example 5

Synthesis of 2-Tetrahydropyranyl methacrylate (THPMA)

2-Tetrahydropyranyl methacrylate (THPMA) was prepared in an analogous manner to the THF-ester above using 24.5 g (0.29 mol) of methacrylic acid, 25.6 g (0.305 mol) of 4,5-dihydropyran and 0.05 g of methanesulfonic acid to yield 35.5 g (72%) of the desired product after distillation at reduced pressure.

Example 6

Synthesis of 2-Tetrahydrofuranyl trifluoromethacrylate (THFTFMA)

2-Tetrahydrofuranyl trifluoromethacrylate (THFTFMA) was prepared in a manner analogous to EETFMA but using water bath cooling. Yield of 18.2 g (87%) of a clear liquid from 14.0 g of 2-TFMAA and 14.0 g of 2,3-dihydroftiran.

Example 7

Synthesis of α-Angelicalactone Methacrylate (ALMA)

α-Angelicalactone (29.54 g, 0.30 mole), methacrylic acid (20.66 g, 0.24 mole), p-toluenesulfonic acid monohydrate (200 mg), and phenothiazine (100 mg) were placed in a round bottom flask equipped with a magnetic stirbar, a water condenser and a nitrogen inlet. The contents were stirred at room temperature. Within about 5 minutes, the reaction became exothermic. The flask was immersed in an ice-bath and stirred for 30 minutes. Afterwards, the ice-bath was removed and stirred at room temperature for 1 hour. The solution was diluted with 150 ml of ether and treated with 1 ml ammonium hydroxide (28% ammonia in water). Some precipitation occurred. The solution was filtered through a fluted filter paper and washed with 2×150 ml saturated sodium bicarbonate solution followed by 1×150 ml brine and dried over anhydrous magnesium sulfate for about an hour. The solvent was removed on a rotary evaporator and distilled under reduced pressureto yield 22.2 grams of the product which was collected between 83° C. and 93° C. at 0.2 mm pressure.

Example 8

Synthesis of α-Angelicalactone Acrylate (ALA)

α-Angelicalactone Acrylate was prepared by a method identical to that described for ALMA. Starting with α-Angelicalactone (19.62 g, 0.20 mole) and acrylic acid (10.80 g, 0.15 mole), 10.3 grams of ALA was collected between 75° C. and 85° C. at 0.2 mm Hg.

Example 9

Synthesis of 3-(5-Bicyclo-[2,2,1]hept-2-yl)-1,1,1-trifluoro-2-(trifluoromethyl)-2-propanol methacrylate (NBHFAMA)

3-(5-Bicyclo-[2,2,1]heptene-2-yl)-1,1,1-trifluoro-2-(trifluoromethyl)-2-propanol (NBHFA) (Central Glass, Japan) (54.8 g, 0.20 mole), methacrylic acid (51.65 g, 0.60 mole) and 50 ml of ether were placed in a round bottom flask equipped with a condenser, magnetic stirrer and a nitrogen inlet. While stirring, concentrated sulfuric acid 96% (6.08 g, 3.25 ml, 0.06 mole) was added dropwise at room temperature via a graduated pipette. A mildly exothermic reaction occurred. The mixture was heated to reflux for 18 hours. Afterwards, the mixture was diluted with 50 ml tetrahydrofuran (THF) and poured cautiously into a sodium bicarbonate solution (50 grams, 0.60 mole in 600 ml DI water) and stirred for 2 hours. The mixture was then extracted with 2×150 ml ether. Combined organic extracts were washed with 150 ml of a saturated sodium bicarbonate solution followed by 150 ml of brine and dried over anhydrous magnesium sulfate. The solution was concentrated in vacuo. Fractional distillation under reduced pressure gave 32.44 grams of the desired product at 140° C. at 2 mm Hg.

Example 10

Synthesis of 3-(5-Bicyclo-[2,2,1]hept-2-yl)-1,1,1-trifluoro-2-(trifluoromethyl)-2-propanol acrylate (NBHFAA)

The acrylate monomer was synthesized using a procedure similar to the one utilized for NBHFAMA.

Example 11

Synthesis of Copoly(NBHFAMA/EMMA) 60/40

To a 100-mL, 3-necked round-bottomed flask equipped with a condenser, nitrogen inlet, temperature monitor, heating mantle and magnetic stirrer was added 9.4 g (0.027 mol) of 3-(5-Bicyclo-[2,2,1]hept-2-yl)-1,1,1-trifluoro-2-(trifluoromethyl)-2-propanol methacrylate (NBHFAMA), 2.53 g (0.018 mol) of EMMA and 38 mL of THF and the mixture heated to near reflux at which time 0.432 g (0.0026 mol) of AIBN was added and the mixture stirred at reflux for six hours. The polymer product was isolated by precipitation from 3 L of hexane and drying at reduced pressure in a vacuum oven at 50° C.

Example 12

Synthesis of Copoly(NBHFAMA/EEMA) 60/40

The copolymer copoly(NBHFAMA/EEMA) was prepared in an analogous fashion to the above EMMA polymer using 9.28 g (0.026 mol) of NBHFAMA and 2.72 g (0.0172 mol) of EEMA and 0.43 g of AIBN.

Example 13

Synthesis of Copoly(NBHFA/THFMA) 60/40

To a 100-mL, 3-necked round-bottomed flask equipped with a condenser, nitrogen inlet, temperature monitor, heating mantle and magnetic stirrer was added 9.3 g (0.026 mol) of NBHFAMA, 2.7 g (0.0172 mol) of THFMA and 38 mL of methyl acetate and the mixture heated to near reflux at which time 0.382 g (0.00172 mol) of VASO-52 was added and the mixture stirred at reflux for six hours and at room temperature overnight. The polymer product was isolated by precipitation from 3 L of hexane and drying at reduced pressure in a vacuum oven at 50° C.

Figure 3:
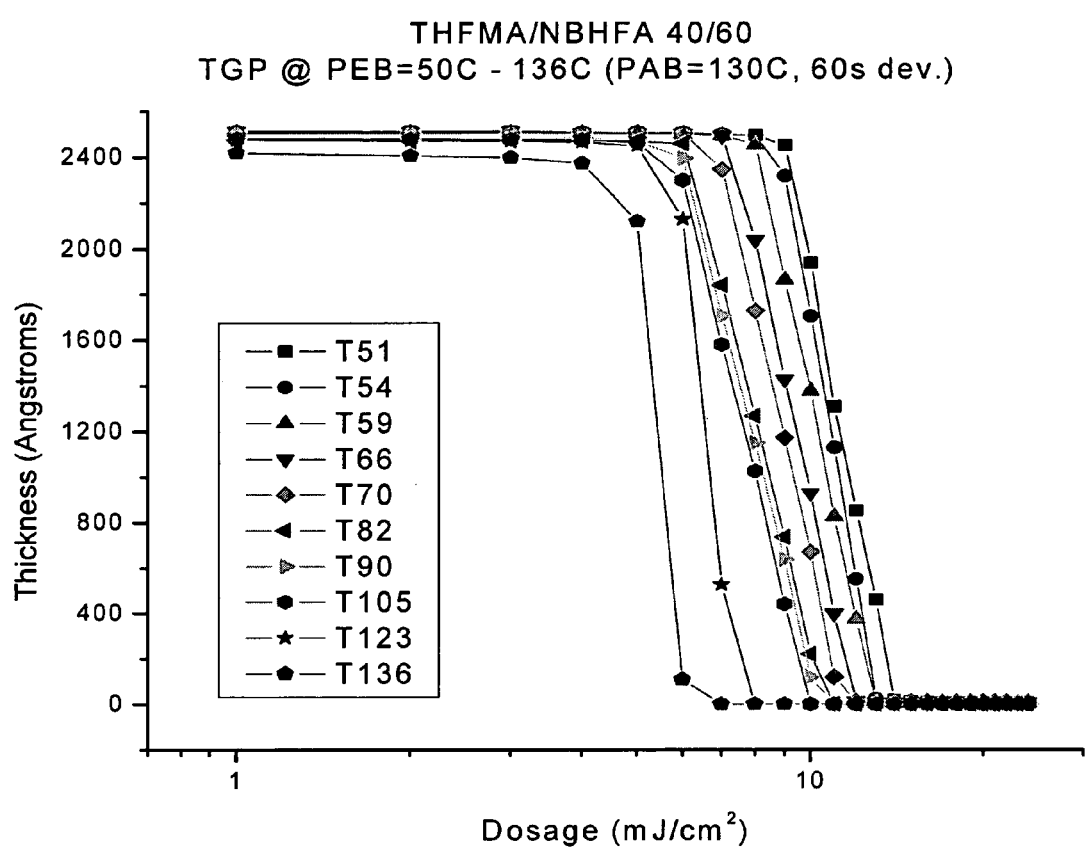
FIG. 3 depicts contrast curves for a resist material based upon a copolymer of THFMA (2-tetrahydrofuranyl methacrylate) and NBHFA (3-(5-Bicyclo-[2,2,1]heptene-2-yl)-1,1,1-trifluoro-2-(trifluoromethyl)-2-propanol) for various post exposure bake (PEB) temperatures.

FIG. 3 depicts contrast curves for a resist material prepared for the NBHFA/THFMA copolymer of this Example. In FIG. 3, the effect of dose on the resist thickness was determined for various post exposure bake temperatures (PEB) and a post applied bake (PAB) of 60 sec. at 130° C.

Figure 4:
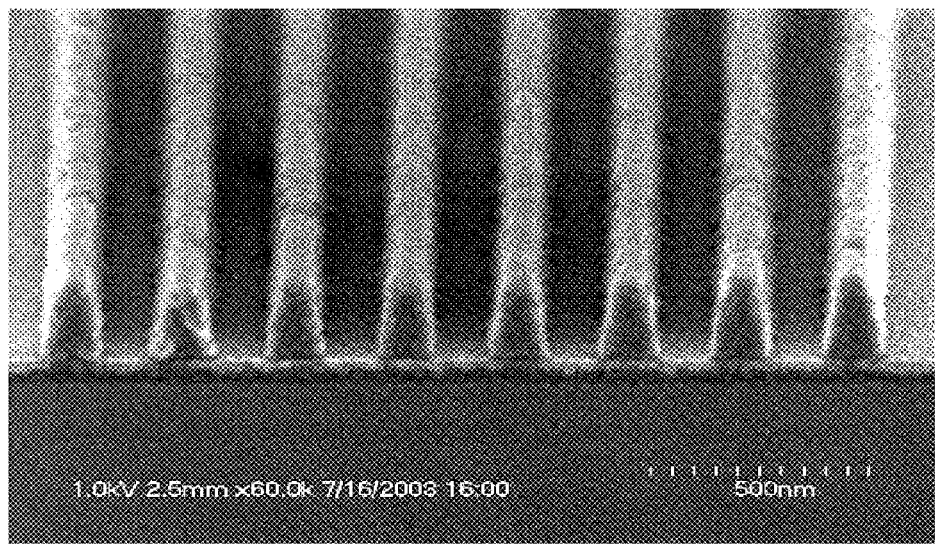
FIG. 4 depicts an SEM photomicrograph of a THFMA/NBHFA copolymer resist prepared at a post exposure bake (PEB) temperature of 50° C. and a dose of 50.4 mJ/cm2.

In FIG. 4, an SEM photomicrograph of the resist of this Example is shown for a PEB of 50° C. and a dose of 50.4 mJ/cm$^2$.

Example 14

Synthesis of Copoly(NBHFAMA/THPMA) 60/40

The copolymer copoly(NBHFAMA/THPMA) 60/40 was prepared in an analogous fashion to the THFMA polymer above using 9.3 g (0.026 mol) of NBHFAMA, 2.94 g (0.0172 mol) of THPMA.

Example 15

Synthesis of Copoly(NBHFAMA/ALMA) 50:50

NBHFAMA (3.60 grams, 0.01 mole), ALMA (1.84 grams, 0.01 mole) and 16 grams of tetrahydrofuran (THF) were placed in a round bottom flask equipped with a condenser and a nitrogen inlet. 2,2'-Azobisisobutyronitrile (AIBN) (0.13 grams, 0.0008 mole) was added to this solution and stirred until dissolved. The solution was then degassed using four vacuum/nitrogen purges. The contents were then heated to reflux for 18 hours. Afterwards, the solution was added dropwise into hexanes (500 ml). The precipitated polymer was filtered (frit), washed twice with hexanes (50 ml) and dried under vacuum at 60° C. Yield: 4.9 grams. Mn=13,900. Polydispersity: 2.4. Tg: 145° C.

Example 16

Synthesis of Terpoly(NBHFA/NBHFAA/ALA) 50:25:25

NBHFA (5.48 g, 0.02 mole), NBHFAA (3.46 grams, 0.01 mole), ALA (1.70 grams, 0.01 mole) and 11 grams of ethylacetate were placed in a round bottom flask equipped with a condenser and a nitrogen inlet. 2,2'-Azobisisobutyronitrile (AIBN) (0.26 grams, 0.0016 mole) was added to this solution and stirred until dissolved. Then, the solution was degassed using four vacuum/nitrogen purges. The contents were then heated to reflux for 18 hours. Afterwards, the solution was added drop wise into hexanes (600 ml). The precipitated polymer was filtered (frit), washed twice with hexanes (50 ml) and dried under vacuum at 60° C. Yield: 6.3 grams. Mn=4,885. Polydispersity: 2.3. Tg: 98° C.

Example 17

Synthesis of Terpoly(THPMA/NLM/IsoBuHFAMA) 45:40:15

THPMA (3.83 grams, 0.0225 mole), 5-methacryloxy-2,6-norbornenecarbolactone (NLM, JSR Corp., Japan) (4.45 grams, 0.02 mole), 1,1-bistrifluoromethyl-1-hydroxy-3-methylbut-4-yl methacrylate (IsoBuHFAMA) (2.31 grams, 0.0074 mole), dodecanethiol (0.051 gram, 0.00025 mole), dimethyl-2,2'-azobisisobutyrate (V-601, Waco Chemicals) and 34 grams of tetrahydrofiran was degassed 3 times with nitrogen/vacuum and heated to reflux under nitrogen for 4.5 hours. The reaction mixture was cooled to room temperature and precipitated in 3.5 liters of hexanes. The solid was collected, washed with three portions of hexanes (150 mL), and dried under vacuum overnight at room temperature. Yield 8.5 grams. Mw=16.6 K Polydispersity 1.888. TGA maximum decomposition rate in air at 147° C.

Example 18

Synthesis of Copoly(NBHFAMA/THPMA) 40:60

The copolymer copoly(NBHFAMA/THPMA) 40:60 was prepared in a similar fashion to the polymer above using 3.6 grams (0.010 mole) of NBHFAMA, 2.53 grams (0.015 mole) of THPMA, 0.026 grams of dodecanethiol, 0.250 grams of dimethyl-2,2'-azobisisobutyrate, and 17 grams of methyl acetate. Yield: 5.1 grams. Mw=24.3 K Polydispersity 1.738. TGA maximum decomposition rate in air at 155° C.

Figure 5:
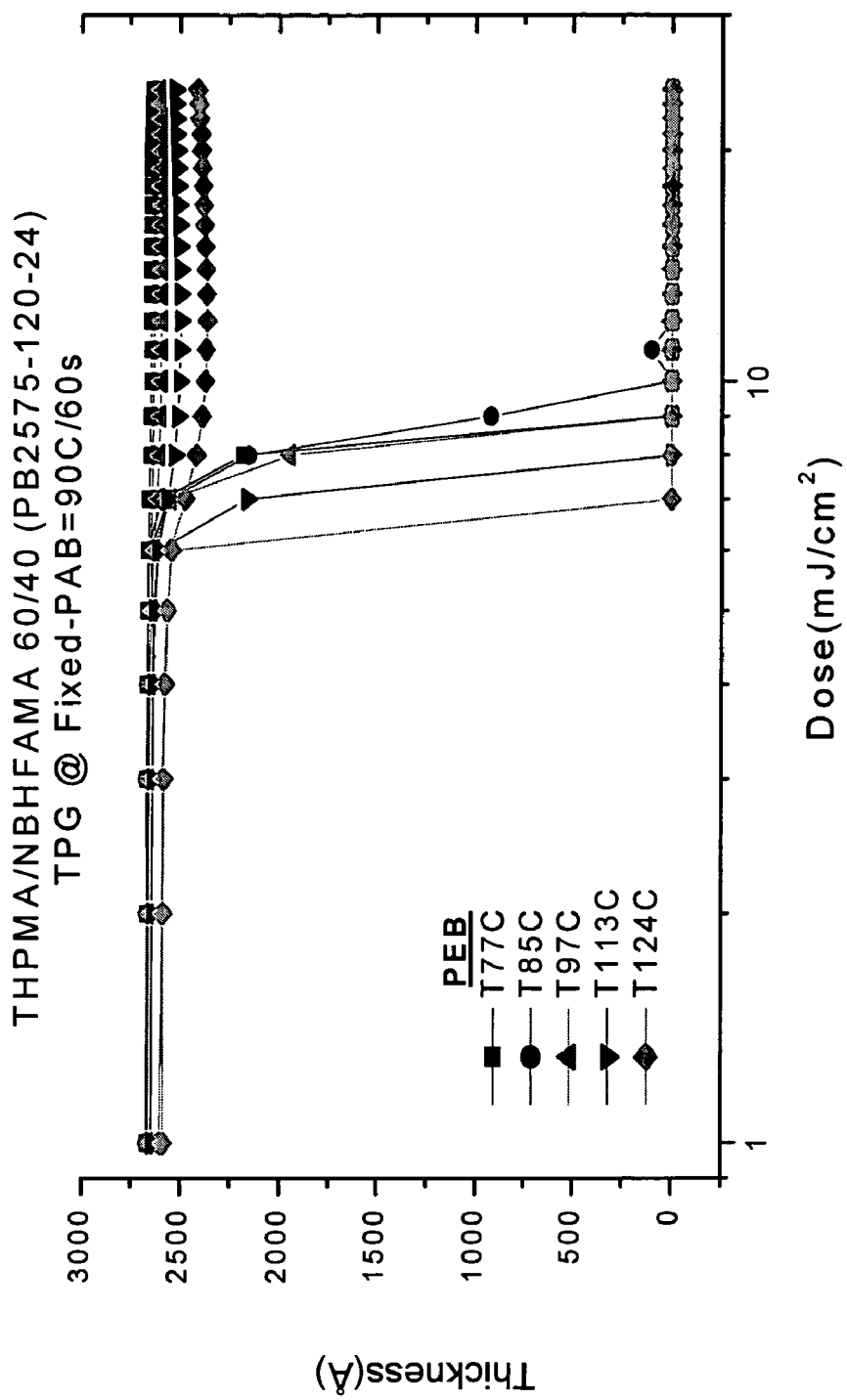
FIG. 5 depicts contrast curves for a resist material based upon a copolymer of THPMA (2-tetrahydropyranyl methacrylate) and NBHFAMA (3-(5-Bicyclo-[2,2,1]hept-2-yl)-1,1,1-trifluoro-2-(trifluoromethyl)-2-propanol methacrylate) for various post exposure bake (PEB) temperatures.

FIG. 5 depicts contrast curves for a resist material prepared for the THPMA/NBHFAMA copolymer of this Example. In FIG. 5, the effect of dose on the resist thickness was determined for various post exposure bake temperatures (PEB) and a post applied bake (PAB) of 60 sec. at 90° C.

Figure 6:
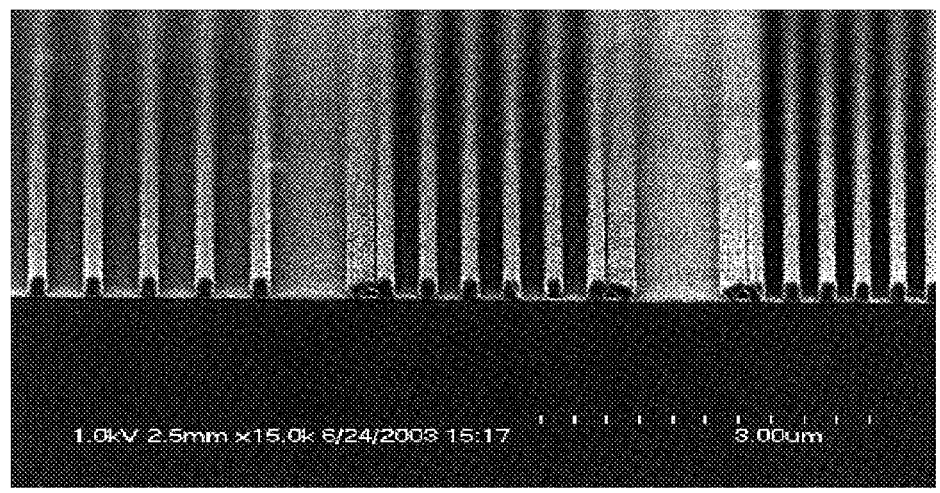
FIG. 6 depicts an SEM photomicrograph of the resist of FIG. 5 for a PEB of 80° C. and a dose of 31 mJ/cm2.

In FIG. 6, an SEM photomicrograph of the resist of this Example is shown for a PEB of 80° C. and a dose of 31 mJ/cm$^2$.

Example 19

Synthesis of Copoly(IsoBuHFAMA/THPMA) 40:60

The copolymer copoly(IsoBuHFAMA/THPMA) 40:60 was prepared in a similar fashion to the polymer above using 3.6 grams (0.010 mole) of NBHFAMA, 2.53 grams (0.015 mole) of THPMA, 0.026 grams of dodecanethiol, 0.239 grams of Vaso 52, and 17 grams of methyl acetate. Yield: 4.43 grams. Mw=12.8 K Polydispersity 1.589. TGA maximum decomposition rate in air at 135° C.

Example 20

Positive Resist Formulation

Copoly(NBHFAMA/ALMA) (50:50) (1.0 grams), and triphenylsulfonium triflate (30 mg) were dissolved in propylene glycol monomethyl ether acetate (PGMEA, 7 grams). Tetrabutylammonium hydroxide (0.3 ml of 1% solution in methanol) was added to this solution and filtered through a 0.20 microns syringe filter.

Example 21

Positive Resist Evaluation

A silicon substrate was coated with 3000 Å of a positive resist composition (Example 20 above). The film was baked at 130° C. for 1 minute to drive off the solvent. The film was then imagewise exposed at 193 nm (dose 15–100 mJ/cm2). It was then baked at 80-90° C. for 1 minute and developed with 0.263 N tetramethyl ammonium hydroxide. High resolution images were obtained with this resist.

Figure 1B:
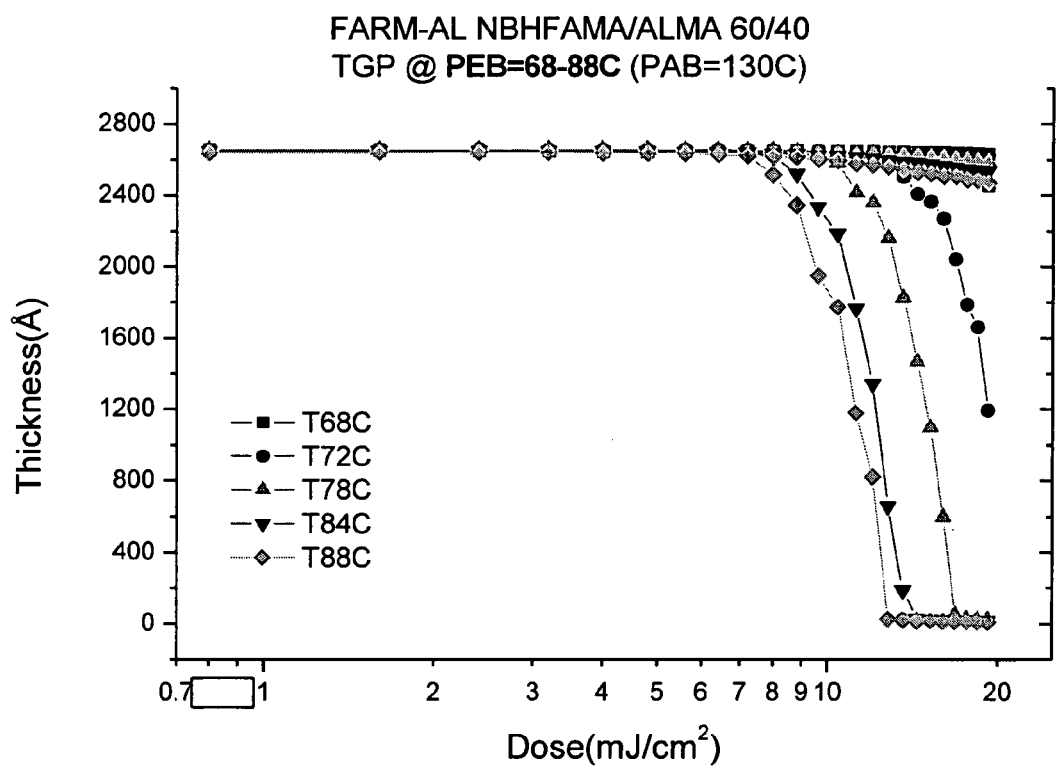

In FIGS. 1A and 1B, contrast curves for a NBHFAMA/ALMA 60/40 copolymer resist are depicted. In FIG. 1A, the contrast curves are shown for post applied bake temperatures (PAB) in the range of 100–130° C. at a PEB of 90° C.; in FIG. 1B, the contrast curves are shown for post exposure bake temperatures in the range of 68–88° C. at a PAB of 130° C.

(Note that in these Figures, and where relevant, all other Figures, the following abbreviations apply: "Ex-FARM" refers to an extended fluoroacrylate resist material; "OD" refers to optical density, in this case 193 nm; "CA" refers to the contact angle, 74.0 degrees; "NA" refers to numerical aperature; "L/S" refers to line spacing; "FT" refers to film thickness; "TGP" refers to thermal gradient plate; "COG" refers to chrome-on-glass; and "AL" refers to ALMA, i.e. angelicalactone methacrylate).

Figure 2:
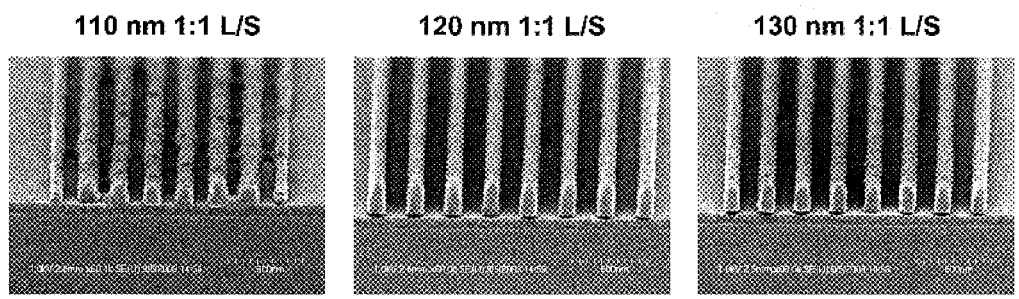
FIG. 2 depicts SEM photomicrographs of a NBHFAMA/ALMA copolymer resist applied to a chrome-on-glass (COG) substrate and exposed at 193 nm.

In FIG. 2, the NBHFAMA/ALMA 60/40 copolymer was applied as a resist material to a chrome-on-glass substrate, exposed at an OD of 193 nm and 0.6 NA at line spacings of 110, 120 and 130 nm and aspect ratios of 1:1. The film thickness was 2600 Å.

We claim:

1. A polymer prepared by polymerization of a monomer mixture, the mixture comprising:
   (a) at least one first olefinic monomer containing an acetal or ketal linkage, the acid-catalyzed cleavage of which renders the polymer soluble in aqueous base; and
   (b) at least one second olefinic monomer selected from (i) an olefinic monomer containing a pendant fluorinated hydroxyalkyl group, (ii) an olefinic monomer containing a pendant fluorinated alkylsulfonamide group, and (iii) combinations thereof.

2. The polymer of claim 1, wherein the acetal or ketal linkage is contained within an acid-cleavable substituent $R^{CL}$ in the first olefinic monomer, the acid-cleavable substituent $R^{CL}$ having the structure

(I)

in which:
   m, n, and q are independently zero or 1;
   $L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;
   X is selected from $C_3$–$C_{30}$ alicyclic and substituted $C_3$–$C_{30}$ alicyclic;
   $L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and
   $R^1$ is selected from acetal-containing and ketal-containing substituents.

3. The polymer of claim 2, wherein:
   $L^1$ is selected from $C_1$–$C_{12}$ alkylene, and heteroatom-containing $C_1$–$C_{12}$ alkylene;
   X is $C_3$–$C_{18}$ alicyclic;
   $L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene; and
   $R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable.

4. The polymer of claim 3, wherein:
   $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to form a cyclic group.

5. The polymer of claim 4, wherein:
   $L^1$ is selected from $C_1$–$C_{12}$ alkylene, and heteroatom-containing $C_1$–$C_{12}$ alkylene;
   X is $C_6$–$C_{12}$ alicyclic; and
   $L^2$ is of the formula —$CR^9R^{10}$— wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl.

6. The polymer of claim 1, wherein the second olefinic monomer contains a pendant fluorinated hydroxyalkyl group $R^H$.

7. The polymer of claim 6, wherein $R^H$ has the structure -$L^3$-$CR^{11}R^{12}$—OH, in which:
   $L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;
   $R^{11}$ is selected from hydrogen, $C_1$–$C_{24}$ alkyl, and substituted $C_1$–$C_{24}$ alkyl; and
   $R^{12}$ is $C_1$–$C_{24}$ alkyl or fluorinated $C_1$–$C_{24}$ alkyl, with the proviso that at least one of $R^{11}$ and $R^{12}$ is fluorinated; and further wherein $R^{11}$ and $R^{12}$ can be taken together to form a ring.

8. The polymer of claim 7, wherein $R^{11}$ is selected from hydrogen, $C_1$–$C_{12}$ alkyl, and $C_1$–$C_{12}$ haloalkyl, and $R^{12}$ is $C_1$–$C_{12}$ alkyl or fluorinated $C_1$–$C_{12}$ alkyl.

9. The polymer of claim 8, wherein $R^{11}$ is selected from hydrogen, $C_1$–$C_8$ alkyl, and fluorinated $C_1$–$C_8$ alkyl, and $R^{12}$ is $C_1$–$C_8$ alkyl or fluorinated $C_1$–$C_8$ alkyl.

10. The polymer of claim 9, wherein $R^{11}$ is selected from hydrogen, $C_1$–$C_4$ alkyl, semi-fluorinated $C_1$–$C_4$ alkyl, and perfluorinated $C_1$–$C_4$ alkyl, and $R^{12}$ is $C_1$–$C_4$ alkyl, semi-fluorinated $C_1$–$C_4$ alkyl, or perfluorinated $C_1$–$C_4$ alkyl.

11. The polymer of claim 10, wherein $R^{11}$ and $R^{12}$ are both trifluoromethyl.

12. The polymer of claim 1, wherein the second olefinic monomer contains a pendant fluorinated alkylsulfonamide group $R^S$.

13. The polymer of claim 12, wherein $R^S$ has the structure -$L^3$-$SO_2$—$NHR^{16}$, in which:
   $L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, combinations thereof; and
   $R^{16}$ is selected from $C_1$–$C_{24}$ alkyl and substituted $C_1$–$C_{24}$ alkyl, $C_1$–$C_{24}$ fluoroalkyl and substituted $C_1$–$C_{24}$ fluoroalkyl.

14. A polymer comprising a first olefinic monomer unit having the structure of formula (II)

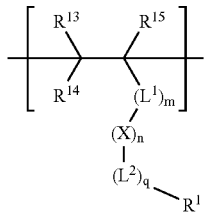

and a second olefinic monomer unit having the structure of formula (III)

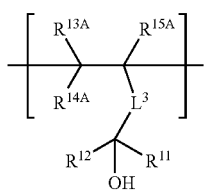

wherein:
- m, n, and q are independently zero or 1;
- $L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;
- X is selected from $C_3$–$C_{30}$ alicyclic and substituted $C_3$–$C_{30}$ alicyclic;
- $L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and
- $R^1$ is selected from acetal-containing and ketal-containing substituents;
- $L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;
- $R^{11}$ is selected from hydrogen, $C_1$–$C_{24}$ alkyl, and substituted $C_1$–$C_{24}$ alkyl;
- $R^{12}$ is $C_1$–$C_{24}$ alkyl or fluorinated $C_1$–$C_{24}$ alkyl, with the proviso that at least one of $R^{11}$ and $R^{12}$ is fluorinated; and further wherein $R^{11}$ and $R^{12}$ can be taken together to form a ring;
- $R^{13}$ and $R^{13A}$ are independently selected from hydrogen, fluorine, $C_1$–$C_{24}$ alkyl, substituted $C_1$–$C_{24}$ alkyl, $C_1$–$C_{24}$ alkoxy, and substituted $C_1$–$C_{24}$ alkoxy; and
- $R^{14}$ and $R^{14A}$ are independently selected from hydrogen, fluorine, $C_1$–$C_{24}$ alkyl and substituted $C_1$–$C_{24}$ alkyl; and
- $R^{15}$ and $R^{15A}$ are independently selected from hydrogen, fluorine, $C_1$–$C_{24}$ alkyl, and substituted $C_1$–$C_{24}$ alkyl, and further wherein any two of $L^1$, $R^{13}$, $R^{14}$, and $R^{15}$ may be taken together to form a ring and any two of $L^3$, $R^{13A}$, $R^{14A}$, and $R^{15A}$ may be taken together to form a ring.

15. The polymer of claim 14, wherein
- $L^1$ is selected from $C_1$–$C_{12}$ alkylene, and heteroatom-containing $C_1$–$C_{12}$ alkylene;
- X is $C_3$–$C_{18}$ alicyclic;
- $L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene;
- $R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable;
- $R^{11}$ is selected from hydrogen, $C_1$–$C_{12}$ alkyl, and $C_1$–$C_{12}$ haloalkyl; and
- $R^{12}$ is $C_1$–$C_{12}$ alkyl or fluorinated $C_1$–$C_{12}$ alkyl; and further wherein $R^{11}$ and $R^{12}$ can be taken together to form a ring.

16. The polymer of claim 15, wherein
- $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to form a cyclic group;
- $R^{11}$ is selected from hydrogen, $C_1$–$C_8$ alkyl, and fluorinated $C_1$–C8 alkyl; and
- $R^{12}$ is $C_1$–$C_8$ alkyl or fluorinated $C_1$–C8 alkyl; and further wherein $R^{11}$ and $R^{12}$ can be taken together to form a ring.

17. The polymer of claim 16, wherein
- $L^1$ is selected from $C_1$–$C_6$ alkylene, and heteroatom-containing $C_1$–$C_6$ alkylene;
- X is $C_6$–$C_{12}$ alicyclic; and
- $L^2$ is of the formula —$CR^9R^{10}$— wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl;
- $R^{11}$ is selected from hydrogen, $C_1$–$C_4$ alkyl, semi-fluorinated $C_1$–$C_4$ alkyl, and perfluorinated $C_1$–$C_4$ alkyl; and
- $R^{12}$ is $C_1$–$C_4$ alkyl, semi-fluorinated $C_1$–$C_4$ alkyl, or perfluorinated $C_1$–$C_4$ alkyl.

18. The polymer of claim 17, wherein $R^{11}$ and $R^{12}$ are both trifluoromethyl.

19. A polymer comprising a first olefinic monomer unit having the structure of formula (II)

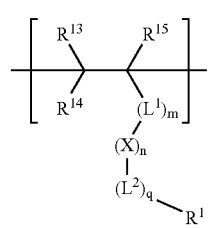

and a second olefinic monomer unit having the structure of formula (IV)

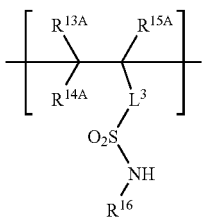

(IV)

wherein:
  m, n, and q are independently zero or 1;
  $L^1$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^1$ is optionally substituted and/or heteroatom-containing $C_1$–$C_{12}$ alkylene, $L^1$ may be linear, branched, or cyclic;
  X is selected from $C_3$–$C_{30}$ alicyclic and substituted $C_3$–$C_{30}$ alicyclic;
  $L^2$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^2$ is optionally substituted and/or heteroatom-containing $C_3$–$C_{12}$ alkylene, $L^2$ may be linear, branched, or cyclic; and
  $R^1$ is selected from acetal-containing and ketal-containing substituents;
  $L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, $C_3$–$C_{15}$ alicyclic, $C_3$–$C_{15}$ fluoroalicyclic, and combinations thereof;
  $R^{13}$ and $R^{13A}$ are independently selected from hydrogen, fluorine, $C_1$–$C_{24}$ alkyl, substituted $C_1$–$C_{24}$ alkyl, $C_1$–$C_{24}$ alkoxy, and substituted $C_1$–$C_{24}$ alkoxy; and
  $R^{14}$ and $R^{14A}$ are independently selected from hydrogen, fluorine, $C_1$–$C_{24}$ alkyl and substituted $C_1$–$C_{24}$ alkyl;
  $R^{15}$ and $R^{15A}$ are independently selected from hydrogen, fluorine, $C_1$–$C_{24}$ alkyl, and substituted $C_1$–$C_{24}$ alkyl, and further wherein any two of $L^1$, $R^{13}$, $R^{14}$, and $R^{15}$ may be taken together to form a ring and any two of $L^3$, $R^{13A}$, $R^{14A}$, and $R^{15A}$ may be taken together to form a ring; and
  $R^{16}$ is selected from $C_1$–$C_{24}$ alkyl and substituted $C_1$–$C_{24}$ alkyl, $C_1$–$C_{24}$ fluoroalkyl and substituted $C_1$–$C_{24}$ fluoroalkyl.

20. The polymer of claim 19, wherein:
  $L^1$ is selected from $C_1$–$C_{12}$ alkylene, and heteroatom-containing $C_1$–$C_{12}$ alkylene;
  X is $C_3$–$C_{18}$ alicyclic;
  $L^2$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene; and
  $R^1$ has the structure —(CO)—O—$CR^4R^5$—O—$CR^6R^7R^8$ in which $R^4$, $R^5$, $R^6$, $R^7$, and $R^8$ are selected so as to render $R^1$ acid-cleavable.

21. The polymer of claim 20, wherein $R^4$, $R^5$, $R^6$, $R^7$, and $R^8$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^4$, $R^5$, $R^6$, $R^7$, and $R^8$ may be linked to form a cyclic group.

22. The polymer of claim 21, wherein
  $L^1$ is selected from $C_1$–$C_6$ alkylene, and heteroatom-containing $C_1$–$C_6$ alkylene;

X is $C_6$–$C_{12}$ alicyclic; and
  $L^2$ is of the formula —$CR^9R^{10}$—, wherein $R^9$ is hydrogen, $C_1$–$C_{12}$ alkyl, or $C_1$–$C_{12}$ fluoroalkyl, and $R^{10}$ is $C_1$–$C_{12}$ alkyl or $C_1$–$C_{12}$ fluoroalkyl.

23. The polymer of claim 1, wherein the monomer mixture comprises two or more different first olefinic monomers.

24. The polymer of claim 1, wherein the monomer mixture further comprises at least one additional olefinic monomer.

25. The polymer of claim 23, wherein monomer mixture further comprises at least one additional olefinic monomer.

26. The polymer of claim 24, wherein the at least one additional olefinic monomer is selected from (i) a monomer containing an acid-cleavable substituent $R^{CL*}$; (ii) a monomer containing an acid-inert, polar substituent, $R^P$; (iii) a monomer containing an acid-inert, nonpolar substituent, $R^{NP}$; and (iv) combinations thereof.

27. The polymer of claim 26, comprising monomer units substituted with $R^P$ and optionally $R^{NP}$.

28. The polymer of claim 26, comprising monomer units substituted with $R^{NP}$ and optionally $R^P$.

29. The polymer of claim 26, wherein $R^{CL*}$ has the structure $$-(L^{1*})_m*-(X^*)_n*-[(L^{2*})_q*-R^{1*}]_r* \qquad (V)$$

in which:
  m*, n*, and q* are independently zero or 1;
  r* is an integer of at least 1;
  $L^{1*}$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^{1*}$ is optionally substituted and/or heteroatom-containing $C_1$–$C_{12}$ alkylene, $L^{1*}$ may be linear, branched, or cyclic;
  X* is selected from $C_3$–$C_{30}$ alicyclic and substituted $C_3$–$C_{30}$ alicyclic;
  $L^{2*}$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^{2*}$ is optionally substituted and/or heteroatom-containing $C_3$–$C_{12}$ alkylene, $L^{2*}$ maybe linear, branched, or cyclic; and
  $R^{1*}$ is selected from acid-cleavable ester, oligomeric ester, ether, carbonate, and orthoester substituents.

30. The polymer of claim 29, wherein:
  r* is 1 or 2;
  $L^{1*}$ is selected from $C_1$–$C_{12}$ alkylene, and heteroatom-containing $C_1$–$C_{12}$ alkylene;
  X* is $C_3$–$C_{18}$ alicyclic;
  $L^{2*}$ is selected from $C_1$–$C_{12}$ alkylene, hydroxyl-substituted $C_1$–$C_{12}$ alkylene, $C_1$–$C^{12}$ fluoroalkylene, and hydroxyl-substituted $C_1$–$C_{12}$ fluoroalkylene; and
  $R^{1*}$ is selected from —(C))—O—$R^{4*}$, -[$Q^{1*}$-(CO)—O—]$_h*$—$R^{5*}$, —O—$R^{6*}$, and —O—(CO)—O—$R^{7*}$;
  h* is an integer in the range of 2 to 8 inclusive,
  $Q^{1*}$ is $C_1$–$C_{12}$ alkylene or $C_1$–$C_{12}$ fluoroalkylene,
  $R^{4*}$ and $R^{6*}$ are selected from (a) hydrocarbyl substituents with a tertiary carbon attachment point, (b) substituents having the structure —$CR^{8*}R^{9*}$—O—$CR^{10*}R^{11*}R^{12*}$, and (c) substituents having the structure —$CR^{13*}(OR^{14*})_2$;
  $R^{5*}$, $R^{7*}$, and $R^{14*}$ are selected from $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl; and
  $R^{8*}$, $R^{9*}$, $R^{10*}$, $R^{11*}$, $R^{12*}$, and $R^{13*}$ are independently selected from hydrogen, $C_4$–$C_{12}$ hydrocarbyl, substituted $C_4$–$C_{12}$ hydrocarbyl, heteroatom-containing $C_4$–$C_{12}$ hydrocarbyl, and substituted heteroatom-containing $C_4$–$C_{12}$ hydrocarbyl, and further wherein any two of $R^{8*}$, $R^{9*}$, $R^{10*}$, $R^{11*}$, and $R^{12*}$ may be linked to form a cyclic group.

31. The polymer of claim 30, wherein:
$L^{1*}$ is selected from $C_1$–$C_6$ alkylene, and heteroatom-containing $C_1$–$C_6$ alkylene;
$X^*$ is $C_6$–$C_{12}$ alicyclic; and
$L^{2*}$ is of the formula —$CR^{9*}R^{10*}$—, wherein $R^{9*}$ is hydrogen, $C_1$–$C_{12}$ alkyl, or $C_1$–$C_{12}$ fluoroalkyl, and $R^{10*}$ is $C_1$–$C_{12}$ alkyl or $C_1$–$C_{12}$ fluoroalkyl.

32. The polymer of claim 31, wherein $R^{1*}$ is of the formula —(CO)—O—$R^{4*}$, wherein $R^{4*}$ is selected from cyclic and acyclic hydrocarbyl substituents with a tertiary carbon attachment point, such that when r* is 1, then $R^{CL*}$ has the structure $$-(L^{1*})_m*-(X^*)_n*—(CR^{9*}R^{10*})_q*—(CO)—O—R^{4*} \quad (VI)$$

33. The polymer of claim 31, wherein $R^{1*}$ is of the formula —O—$R^{6*}$, wherein $R^{6*}$ is selected from cyclic and acyclic hydrocarbyl substituents with a tertiary carbon attachment point, such that when r* is 1, then $R^{CL*}$ has the structure $$-(L^{1*})_m*-(X^*)_n*—(CR^{9*}R^{10*})_q*—O—R^{6*}. \quad (VII)$$

34. The polymer of claim 32, wherein $R^{4*}$ is selected from t-butyl, 2-methyl-2-norbornyl, 2-methyl-2-adamantyl, 2-ethyl-2-adamantyl, isobornyl, 2-methyl-2-isobornyl, 2-methyl-2-tetracyclododecyl, 1-methylcyclohexyl, 1-ethylcyclohexyl, 1-butylcyclohexyl, 1-methylcyclopentyl, 1-ethylcyclopentyl, and 1-butylcyclopentyl.

35. The polymer of claim 33, wherein $R^{6*}$ is selected from t-butyl, 2-methyl-2-norbornyl, 2-methyl-2-adamantyl, 2-ethyl-2-adamantyl, isobornyl, 2-methyl-2-isobornyl, 2-methyl-2-tetracyclododecyl, 1-methylcyclohexyl, 1-ethylcyclohexyl, 1-butylcyclohexyl, 1-methylcyclopentyl, 1-ethylcyclopentyl, and 1-butylcyclopentyl.

36. The polymer of claim 26, wherein $R^P$ has the structure $$-(L^3)_{m1}-(Y)_{n1}-(L^4)_{q1}-R^{18} \quad (VIII)$$

in which:
m1, n1, and q1 are independently zero or 1;
$L^3$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^3$ is optionally substituted and/or heteroatom-containing $C_1$–$C_{12}$ alkylene, $L^1$ may be linear, branched, or cyclic;
Y is selected from $C_3$–$C_{30}$ alicyclic and substituted $C_3$–$C_{30}$ alicyclic;
$L^4$ is selected from $C_1$–$C_{12}$ alkylene, substituted $C_1$–$C_{12}$ alkylene, $C_1$–$C_{12}$ heteroalkylene, substituted $C_1$–$C_{12}$ heteroalkylene, and further wherein when $L^4$ is optionally substituted and/or heteroatom-containing $C_3$–$C_{12}$ alkylene, $L^4$ may be linear, branched, or cyclic; and
$R^{18}$ is an acid-inert polar organic group containing a heteroatom with a Pauling electronegativity greater than about 3.00.

37. The polymer of claim 36, wherein:
$L^3$ is selected from $C_1$–$C_{12}$ alkylene, and heteroatom-containing $C_1$–$C_{12}$ alkylene;
Y is $C_3$–$C_{18}$ alicyclic; and
$L^4$ is selected from $C_1$–$C_{12}$ alkylene, hydroxyl-substituted $C_1$–$C_{12}$ alkylene, $C_1$–$C_{12}$ fluoroalkylene, and hydroxyl-substituted $C_1$–$C_{12}$ fluoroalkylene.

38. The polymer of claim 37, wherein:
$L^3$ is selected from $C_1$–$C_6$ alkylene, and heteroatom-containing $C_1$–$C_6$ alkylene;
Y is $C_6$–$C_{12}$ alicyclic; and
$L^4$ is of the formula —$CR^{21}CR^{22}$— wherein $R^{21}$ is hydrogen, $C_1$–$C_{12}$ alkyl, or $C_1$–$C_{12}$ fluoroalkyl, and $R^{22}$ is $C_1$–$C_{12}$ alkyl or $C_1$–$C_{12}$ fluoroalkyl, such that $R^P$ has the structure $$-(L^3)_{m1}-(Y)_{n1}—(CR^{21}R^{22})_{q1}—R^{18}. \quad (IX)$$

39. The polymer of claim 38, wherein the heteroatom within $R^{18}$ is O or N.

40. The polymer of claim 39, wherein $R^{18}$ is selected from hydroxyl, carboxyl, $C_1$–$C_{12}$ alkoxy, $C_1$–$C_{12}$ fluoroalkoxy, hydroxyl-substituted $C_1$–$C_{12}$ alkoxy, hydroxyl-substituted $C_1$–$C_{12}$ fluoroalkoxy, $C_2$–$C_{12}$ alkoxyalkyl, fluorinated $C_2$–$C_{12}$ alkoxyalkyl, hydroxyl-substituted $C_2$–$C_{12}$ alkoxyalkyl, fluorinated hydroxyl-substituted $C_2$–$C_{12}$ alkoxyalkyl, hydroxyl-substituted $C_1$–$C_{12}$ alkyl, hydroxyl-substituted $C_1$–$C_{12}$ fluoroalkyl, carboxyl-substituted $C_1$–$C_{12}$ alkyl, carboxyl-substituted $C_1$–$C_{12}$ fluoroalkyl, $C_2$–$C_{12}$ acyl, fluorinated $C_2$–$C_{12}$ acyl, hydroxyl-substituted $C_2$–$C_{12}$ acyl, fluorinated hydroxyl-substituted $C_2$–$C_{12}$ acyl, $C_2$–$C_{12}$ acyloxy, fluorinated $C_2$–$C_{12}$ acyloxy, hydroxyl-substituted $C_2$–$C_{12}$ acyloxy, fluorinated hydroxyl-substituted $C_2$–$C_{12}$ acyloxy, amino, mono- and di-($C_1$–$C_{12}$ alkyl)-substituted amino, amido, mono- and di-($C_2$–$C_{12}$ alkyl)amido, sulfonamido, N-heteroalicyclic, oxo-substituted N-heterocyclic, and, where the substituents permit, combinations of two or more of the foregoing.

41. The polymer of claim 26, wherein $R^P$ is selected from lactone, anhydride, sulfonamide, fluoroalkanol, alkanol, alicyclic alkanol, esters, ethers, and a combination thereof.

42. The polymer of claim 26, wherein $R^{NP}$ is $C_1$–$C_{18}$ hydrocarbyl or fluorinated $C_1$–$C_{18}$ hydrocarbyl.

43. The polymer of claim 14, wherein the first olefinic monomer unit is derived from a monomer having a structure selected from the formulae 44. The polymer of claim 43, wherein $R^{15}$ is selected from hydrogen, fluorine, $C_1$–$C_{24}$ alkyl, and fluorinated $C_1$–$C_{24}$ alkyl.

45. The polymer of claim 19, wherein the first olefinic monomer unit is derived from a monomer having a structure selected from the formulae

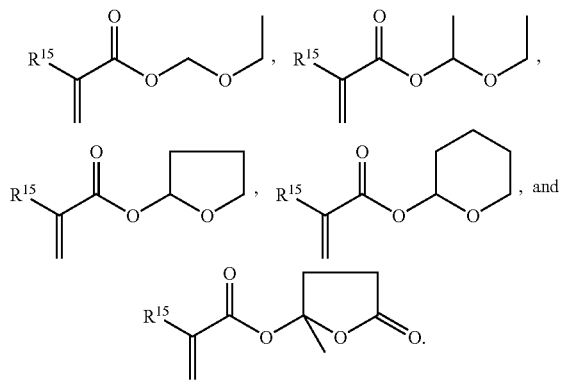

46. The polymer of claim 45, wherein $R^{15}$ is selected from hydrogen, fluorine, $C_1$–$C_{24}$ alkyl, and fluorinated $C_1$–$C_{24}$ alkyl.

47. A lithographic photoresist composition comprising the polymer of claim 1 and a photoacid generator.

48. The composition of claim 47, further comprising an additive selected from dissolution modifying additives, basic compounds, photospeed control agents, crosslinking agents, surfactants, adhesion promoters, and anti-foaming agents.

49. The composition of claim 48, wherein the dissolution modifying additive is a dissolution inhibitor.

50. The composition of claim 47, further comprising an additional polymer.

51. The composition of claim 50, wherein the polymer is selected from fluorine-containing polymers and non-fluorine-containing polymers.

52. The composition of claim 47, further comprising a solvent.

53. The composition of claim 47, wherein the photoacid generator is an onium salt selected from sulfonium salts and iodonium salts.

54. A lithographic photoresist composition comprising the polymer of claim 14 and a photoacid generator.

55. A lithographic photoresist composition comprising the polymer of claim 19 and a photoacid generator.

56. A polymer blend composition comprising the polymer of claim 1 and at least one additional polymer.

* * * * *